(12) United States Patent
Tanabe et al.

(10) Patent No.: US 11,587,711 B2
(45) Date of Patent: Feb. 21, 2023

(54) ELECTRONIC COMPONENT

(71) Applicant: Murata Manufacturing Co., Ltd., Kyoto-fu (JP)

(72) Inventors: Shimpei Tanabe, Nagaokakyo (JP); Rikiya Sano, Nagaokakyo (JP); Hiromi Miyoshi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 967 days.

(21) Appl. No.: 16/373,535

(22) Filed: Apr. 2, 2019

(65) Prior Publication Data
US 2019/0311832 A1 Oct. 10, 2019

(30) Foreign Application Priority Data

Apr. 6, 2018 (JP) .............................. JP2018-073857

(51) Int. Cl.
*H01F 17/00* (2006.01)
*H01G 4/005* (2006.01)
*H01G 4/30* (2006.01)
*H01F 41/04* (2006.01)
*H05K 1/16* (2006.01)
(Continued)

(52) U.S. Cl.
CPC ....... *H01F 17/0013* (2013.01); *H01F 41/041* (2013.01); *H01G 4/005* (2013.01); *H01G 4/232* (2013.01); *H01G 4/30* (2013.01); *H05K 1/16* (2013.01); *H05K 3/4629* (2013.01); *H05K 2201/09781* (2013.01)

(58) Field of Classification Search
CPC ... H01F 17/0013; H01F 41/041; H01G 4/005; H01G 4/232; H01G 4/30; H05K 1/16; H05K 3/4629; H05K 2201/09781
See application file for complete search history.

(56) References Cited

U.S. PATENT DOCUMENTS

| 2011/0037540 A1* | 2/2011 | Matsushita ......... H01P 1/20345 |
| | | 333/204 |
| 2014/0253277 A1* | 9/2014 | Takezawa ........... H01F 27/2804 |
| | | 336/200 |

(Continued)

FOREIGN PATENT DOCUMENTS

| CN | 108233678 A | 6/2018 |
| JP | 2001-134732 A | 5/2001 |

*Primary Examiner* — Michael P McFadden
(74) *Attorney, Agent, or Firm* — Studebaker & Brackett PC

(57) ABSTRACT

An electronic component includes a body having a side surface, coil conductor layers wound along main surfaces parallel to the side surface, and capacitor conductor layers each having a substantially plate-like shape parallel to the side surface. The coil conductor layers and the capacitor conductor layers are arranged in a widthwise direction perpendicular to the side surface. The capacitor conductor layers include first and second capacitor conductor layers adjacent to each other in the widthwise direction. The coil conductor layers include a first coil conductor layer that is in the same layer as the first capacitor conductor layer and a second coil conductor layer that is in the same layer as the second capacitor conductor layer. The shortest distance between the first coil conductor layer and the first capacitor conductor layer is larger than the shortest distance between the second coil conductor layer and the second capacitor conductor layer.

21 Claims, 8 Drawing Sheets

(51) Int. Cl.
  *H05K 3/46* (2006.01)
  *H01G 4/232* (2006.01)

(56) References Cited

U.S. PATENT DOCUMENTS

| | | | | |
|---|---|---|---|---|
| 2015/0318110 A1* | 11/2015 | Lee | ........................ | H01G 4/30 |
| | | | | 361/301.4 |
| 2016/0014886 A1* | 1/2016 | Kim | ..................... | H05K 3/3442 |
| | | | | 361/767 |
| 2017/0229247 A1* | 8/2017 | Yoneda | ............... | H01F 17/0013 |
| 2018/0174758 A1* | 6/2018 | Lee | ........................ | H01G 4/232 |

* cited by examiner

ELECTRONIC COMPONENT

CROSS-REFERENCE TO RELATED APPLICATION

This application claims benefit of priority to Japanese Patent Application No. 2018-073857, filed Apr. 6, 2018, the entire content of which is incorporated herein by reference.

BACKGROUND

Technical Field

The present disclosure relates to an electronic component.

Background Art

In recent years, with the shift of carrier frequencies of communication devices such as cellular phones to higher frequencies, LC resonance circuits supporting high frequencies in GHz bands are used in signal transmission units and signal reception units of these devices. There is a case where an electronic component including a coil and a capacitor is used as such an LC resonance circuit, as described, for example, in Japanese Unexamined Patent Application Publication No. 2001-134732.

SUMMARY

Since two elements, which are a coil and a capacitor, are included in the above-mentioned electronic component, it is more likely that the resonant frequency will vary compared with the case of an LC resonance circuit that uses a coil component and a capacitor component. Accordingly, embodiments described in the present disclosure reduce variations in such characteristics.

An electronic component according to an aspect of the present disclosure includes a body having a first side surface, a plurality of coil conductor layers each of which is wound in the body parallel to the first side surface, and a plurality of capacitor conductor layers each of which is disposed in the body and each of which has a substantially plate-like shape parallel to the first side surface. The plurality of coil conductor layers are arranged in a lamination direction that is perpendicular to the first side surface, and the plurality of capacitor conductor layers are arranged in the lamination direction. The plurality of capacitor conductor layers include a first capacitor conductor layer and a second capacitor conductor layer that are adjacent to each other in the lamination direction. The plurality of coil conductor layers include a first coil conductor layer that is in the same layer as the first capacitor conductor layer and a second coil conductor layer that is in the same layer as the second capacitor conductor layer. The shortest distance between the first coil conductor layer and the first capacitor conductor layer is larger than shortest distance between the second coil conductor layer and the second capacitor conductor layer. With this configuration, variations in characteristics can be reduced.

In the above-described electronic component, it is preferable that the first capacitor conductor layer has a shape along the first coil conductor layer with a fixed first gap and that the second capacitor conductor layer has a shape along the second coil conductor layer with a fixed second gap. In addition, it is preferable that the fixed first gap be larger than the fixed second gap. With this configuration, occurrence of variations in the characteristics can be further suppressed.

In the above-described electronic component, it is preferable that each of the plurality of coil conductor layers be in the same layer as one of the plurality of capacitor conductor layers and that each of the capacitor conductor layers, which are in the same layers as the corresponding coil conductor layers, has a shape along the corresponding coil conductor layer with a fixed gap. In addition, it is preferable that each of the fixed gaps is correspond to one of the first gap and the second gaps and that the first gaps and the second gaps be alternately arranged in the lamination direction. With this configuration, the occurrence of variations in the characteristics can be further suppressed.

In the above-described electronic component, it is preferable that the plurality of coil conductor layers include parallel portions that are electrically connected in parallel to each other. With this configuration, the characteristics of the electronic component can be adjusted by the parallel portions.

In the above-described electronic component, it is preferable that each of the plurality of coil conductor layers be in the same layer as one of the plurality of capacitor conductor layers and be wound in less than one turn. In addition, it is preferable that a cutout portion of each of the plurality of coil conductor layers that is located between two end portions of the coil conductor layer face the corresponding capacitor conductor layer, which is in the same layer as the coil conductor layer. With this configuration, unevenness in the arrangement of the conductor layers in the body can be reduced, and thus, variations in thermal stress in the body can be reduced.

In the above-described electronic component, it is preferable that the plurality of coil conductor layers include a coil conductor layer that is in the same layer as one of the plurality of capacitor conductor layers and that is wound in less than one turn, the coil conductor layer including a cutout portion that is located between two end portions of the coil conductor layer and that does not face the capacitor conductor layer, which is in the same layer as the coil conductor layer. With this configuration, an adjustable range of an obtainable capacitance value can be further increased.

It is preferable that the above-described electronic component further include a first outer electrode and a second outer electrode that are exposed at the body and that the first outer electrode, the plurality of coil conductor layers, and the second outer electrode be electrically connected in series to one another in this order. In addition, it is preferable that each of the plurality of capacitor conductor layers be electrically connected to one of the first outer electrode and the second outer electrode and that the capacitor conductor layers connected to the first outer electrode and the capacitor conductor layers connected to the second outer electrode be alternately arranged along the lamination direction. With this configuration, a parallel LC resonance circuit can be formed between the first outer electrode and the second outer electrode.

In the above-described electronic component, it is preferable that the body have a mounting surface that is perpendicular to the first side surface and at which the first outer electrode and the second outer electrode are exposed and that the mounting surface, the first capacitor conductor layer, and the first coil conductor layer be arranged in this order in a direction perpendicular to the mounting surface. With this configuration, the characteristics of the electronic component can be improved.

In the above-described electronic component, it is preferable that the body have a first end surface and a second end surface that are perpendicular to the first side surface and the mounting surface. In addition, it is preferable that only the first outer electrode be exposed at the first end surface and that only the second outer electrode be exposed at the second end surface. With this configuration, the mountability of the electronic component can be improved.

It is preferable that the above-described electronic component further include a first extended conductor layer extending parallel to the first side surface in the body and electrically connecting at least one of the plurality of coil conductor layers and the first outer electrode to each other and a dummy conductor layer that is in the same layer as the first extended conductor layer and that is not connected to any of the plurality of coil conductor layers, the plurality of capacitor conductor layers, the first outer electrode, the second outer electrode, and the first extended conductor layer. In addition, it is preferable that, when viewed in the lamination direction, the dummy conductor layer overlap one of the plurality of capacitor electronic components. With this configuration, unevenness in the arrangement of the conductor layers in the body can be reduced, and thus, variations in thermal stress in the body can be reduced.

In the above-described electronic component, it is preferable that the plurality of capacitor conductor layers include a third capacitor conductor layer that is in the same layer as the first extended conductor layer and a fourth capacitor conductor layer that is adjacent to the third capacitor conductor layer in the lamination direction. In addition, it is preferable that, when viewed in the lamination direction, the first extended conductor layer and the dummy conductor layer do not overlap the fourth capacitor conductor layer. With this configuration, the likelihood of a short-circuit occurring between the coil conductor layers and the capacitor conductor layers can be reduced without affecting the capacitance value.

In the above-described electronic component, it is preferable that each of the plurality of capacitor conductor layers has a shape along at least one of the first outer electrode and the second outer electrode with a fixed third gap. With this configuration, an obtainable capacitance value can be adjusted by the third gaps.

In the above-described electronic component, it is preferable that the fixed third gap related to the first capacitor conductor layer be larger than the fixed third gap related to the second capacitor conductor layer. With this configuration, the occurrence of variations in the capacitance value can be further suppressed.

Note that, in the present specification, the wording "be in the same layer" refers to the case where layers such as a coil conductor layer, a capacitor conductor layer, an extended conductor layer, or a dummy conductor layer are aligned with each other in an in-layer direction perpendicular to the lamination direction, that is, a direction parallel to the first side surface.

According to an aspect of the present disclosure, variations in a resonant frequency can be reduced.

Other features, elements, characteristics and advantages of the present disclosure will become more apparent from the following detailed description of embodiments of the present disclosure with reference to the attached drawings.

DETAILED DESCRIPTION

Figure 1:
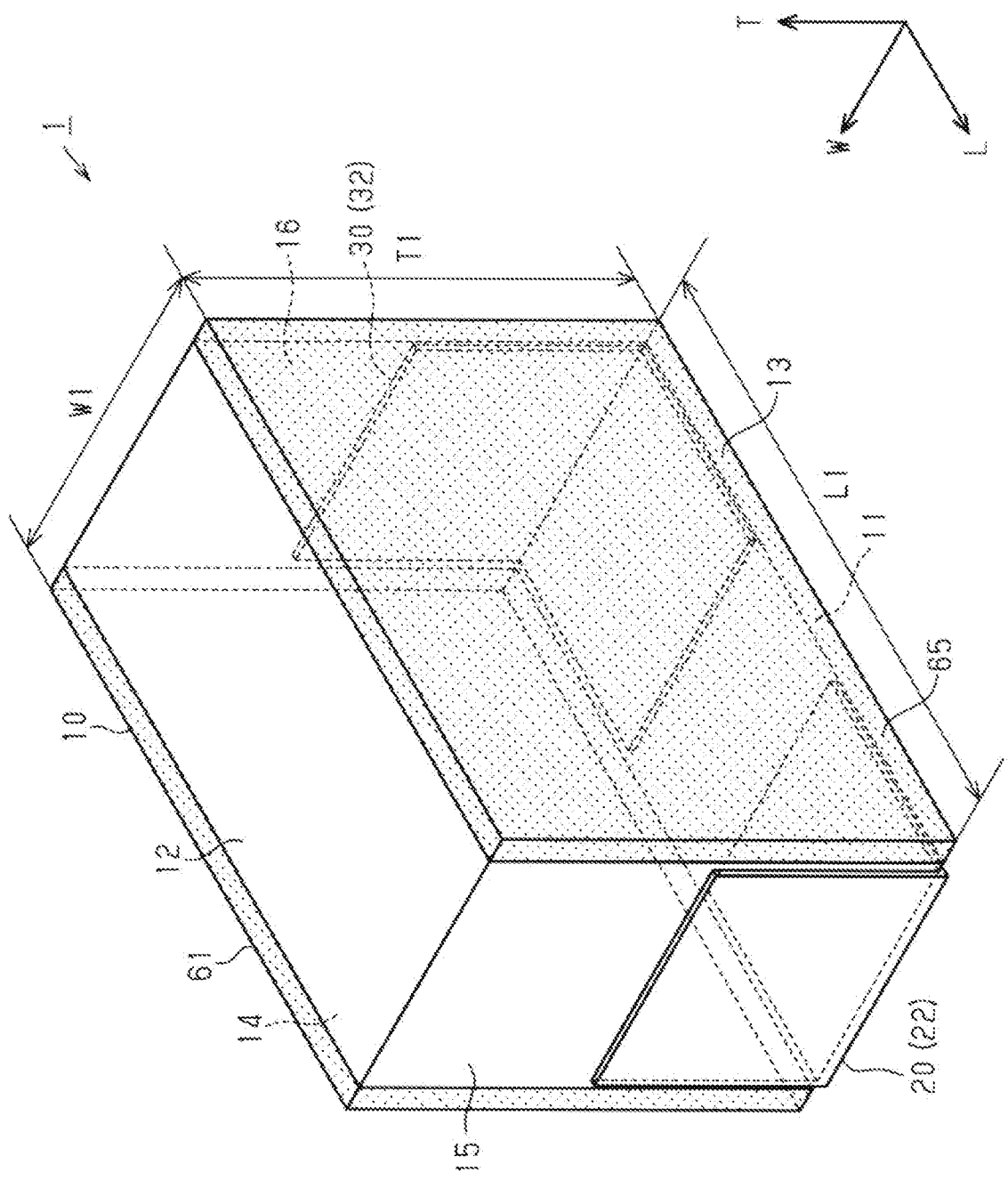
FIG. 1 is a schematic perspective view of an electronic component.

An embodiment of the present disclosure will be described below.

Note that some components may sometimes be illustrated in an enlarged manner in the accompanying drawings for ease of understanding. The dimensional ratios of the components may sometimes be different from the dimensional ratios of actual components or may sometimes differ between those in the drawings. Although hatching is used in a cross-sectional view for ease of understanding, the hatching may sometimes be omitted for some of the components.

FIG. 1 is a schematic perspective view illustrating the appearance of an electronic component 1. The electronic component 1 includes a body 10. The body 10 is a base member in or on which components of the electronic component 1 are arranged, and the body 10 has a substantially rectangular parallelepiped shape. Note that, in the present specification, the term "substantially rectangular parallelepiped shape" includes a substantially rectangular parallelepiped shape having a corner portion or a ridge line portion that is chamfered and a substantially rectangular parallelepiped shape having a corner portion or a ridge line portion that is rounded. In addition, the "substantially rectangular parallelepiped shape" may include a shape having, for example, irregularities formed on portions of or the entire main and side surfaces thereof and a shape having opposing surfaces that are not completely parallel to each other and are slightly inclined.

The body 10 has a mounting surface 11. The mounting surface 11 refers to a surface that faces a circuit board when the electronic component 1 is mounted onto the circuit board. The body 10 further has an upper surface 12 that is parallel to the mounting surface 11. The body 10 further has two pairs of surfaces that are perpendicular to the mounting surface 11. Among these two pairs of surfaces, the first pair of surfaces will be referred to as a first side surface 13 and a second side surface 14, and the second pair of surfaces will be referred to as a first end surface 15 and a second end surface 16. Note that the first end surface 15 and the second end surface 16 are perpendicular to the first side surface 13 and the second side surface 14.

In the present specification, a direction perpendicular to the upper surface 12 and the mounting surface 11 will be referred to as a "heightwise direction". A direction perpendicular to the first side surface 13 and the second side surface 14 will be referred to as a "widthwise direction". A direction perpendicular to the first end surface 15 and the second end surface 16 will be referred to as a "lengthwise direction". As a specific example, a "lengthwise direction L", a "heightwise direction T", and a "widthwise direction W" are illustrated in FIG. 1. In addition, a size in the "widthwise direction W", a size in the "heightwise direction T", and a size in the "lengthwise direction L" will be referred to as a "width dimension", a "height dimension", and a "length dimension", respectively. Note that, in the "heightwise direction T", the side on which the mounting surface 11 of the electronic component 1 is present will hereinafter be referred to as a lower side, and the side on which the upper surface 12 of the electronic component 1 is present will hereinafter be referred to as an upper side.

It is preferable that the size of the body 10 in the lengthwise direction L (a length dimension L1) be larger than about 0 mm and be about 1.0 mm or smaller (i.e., from about 0 mm to about 1.0 mm). In the present embodiment, for example, the length dimension L1 is about 0.6 mm. It is preferable that the size of the body 10 in the widthwise direction W (a width dimension W1) be larger than about 0 mm and be about 0.6 mm or smaller (i.e., from about 0 mm and be about 0.6 mm). The width dimension W1 is more preferably about 0.36 mm or smaller, and further preferably about 0.33 mm or smaller. In the present embodiment, for example, the width dimension W1 of the body 10 is about 0.3 mm. It is preferable that the size of the body 10 in the heightwise direction T (a height dimension T1) be larger than about 0 mm and be about 0.8 mm or smaller (i.e., from about 0 mm to about 0.8 mm). In the present embodiment, for example, the height dimension T1 of the body 10 is about 0.4 mm. In addition, in the present embodiment, the height dimension T1 of the body 10 is larger than the width dimension W1 of the body 10 (T1>W1).

Figure 2:
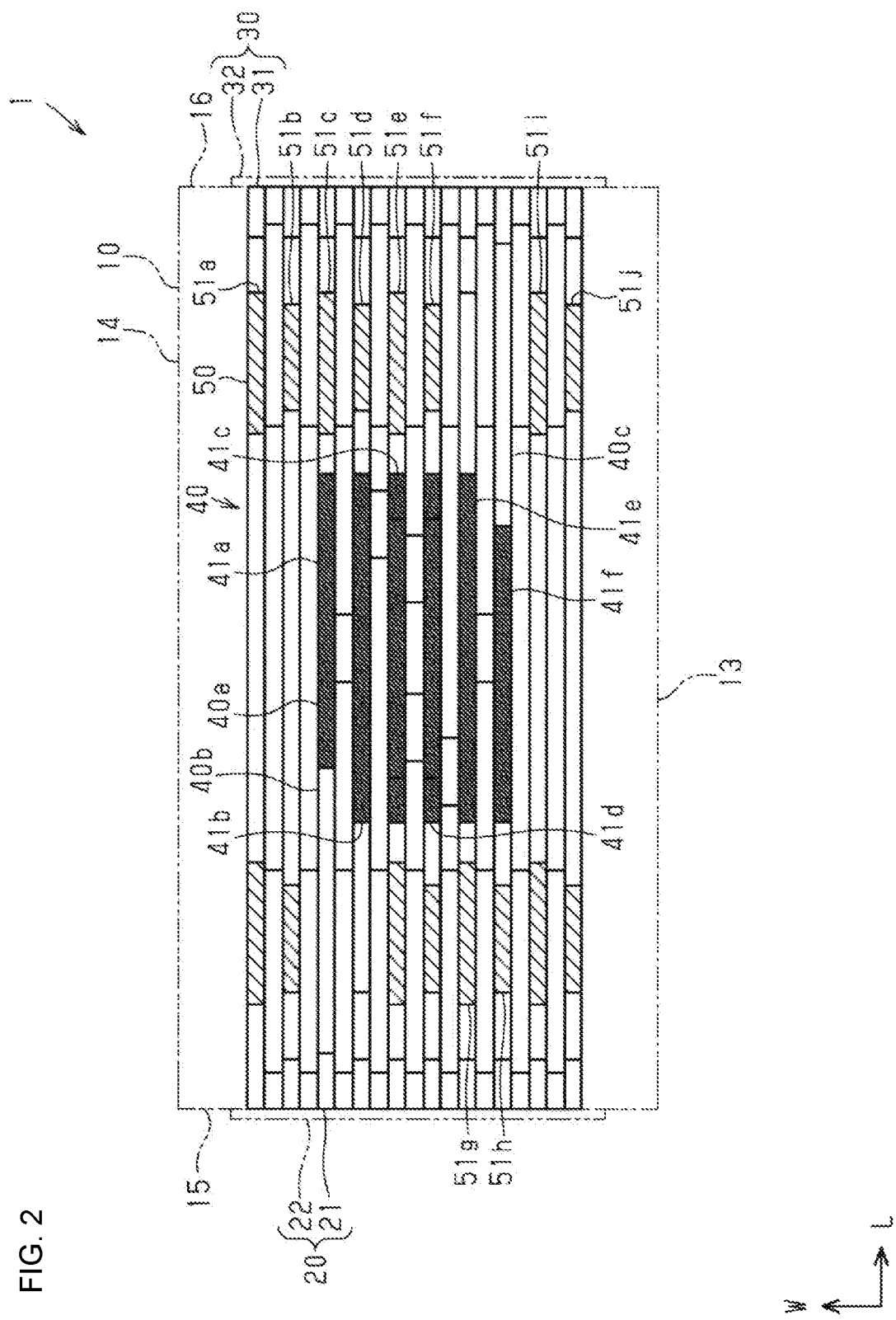
FIG. 2 is a schematic plan view of the electronic component.
Figure 3:
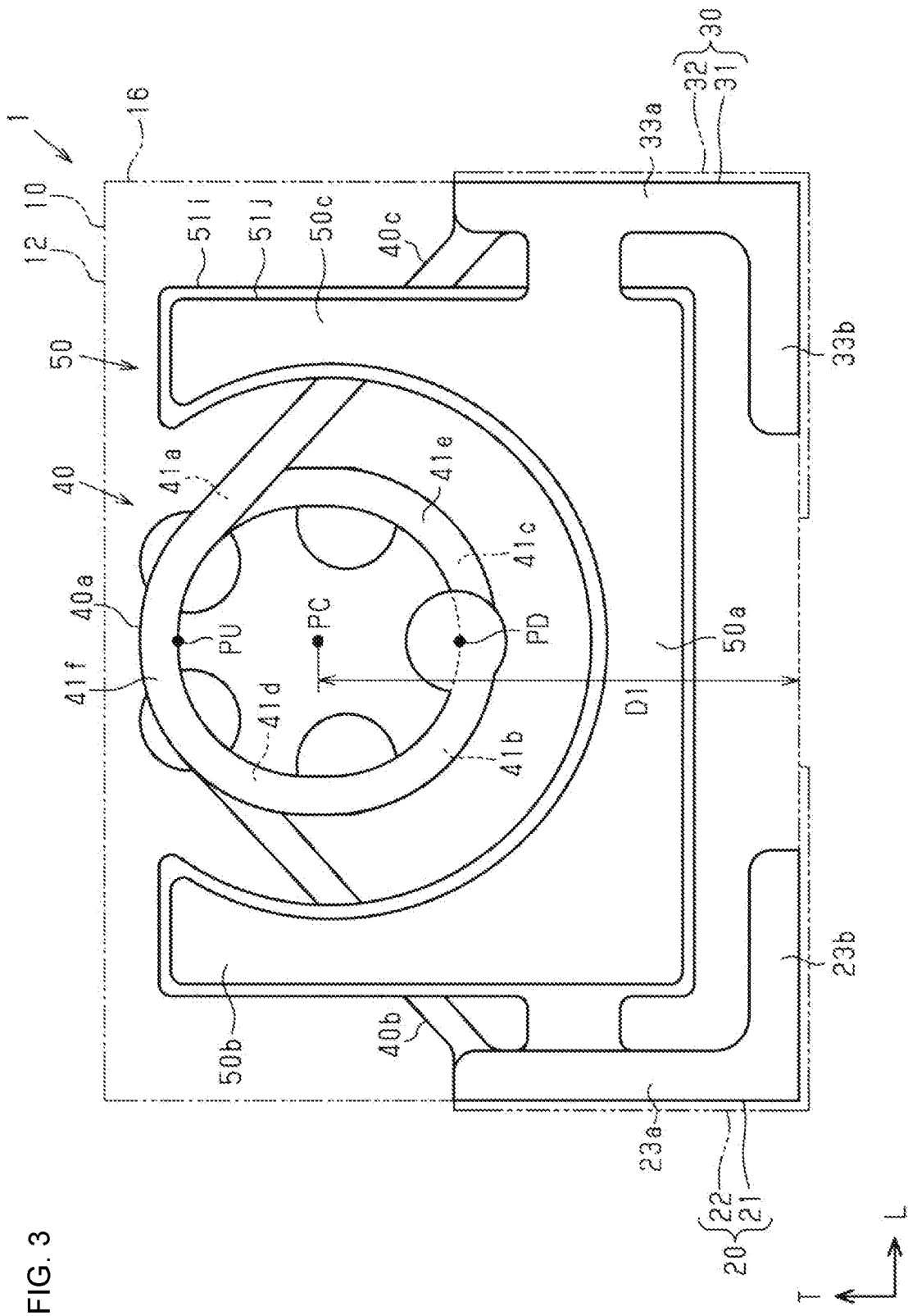
FIG. 3 is a schematic front view of the electronic component.
Figure 4:
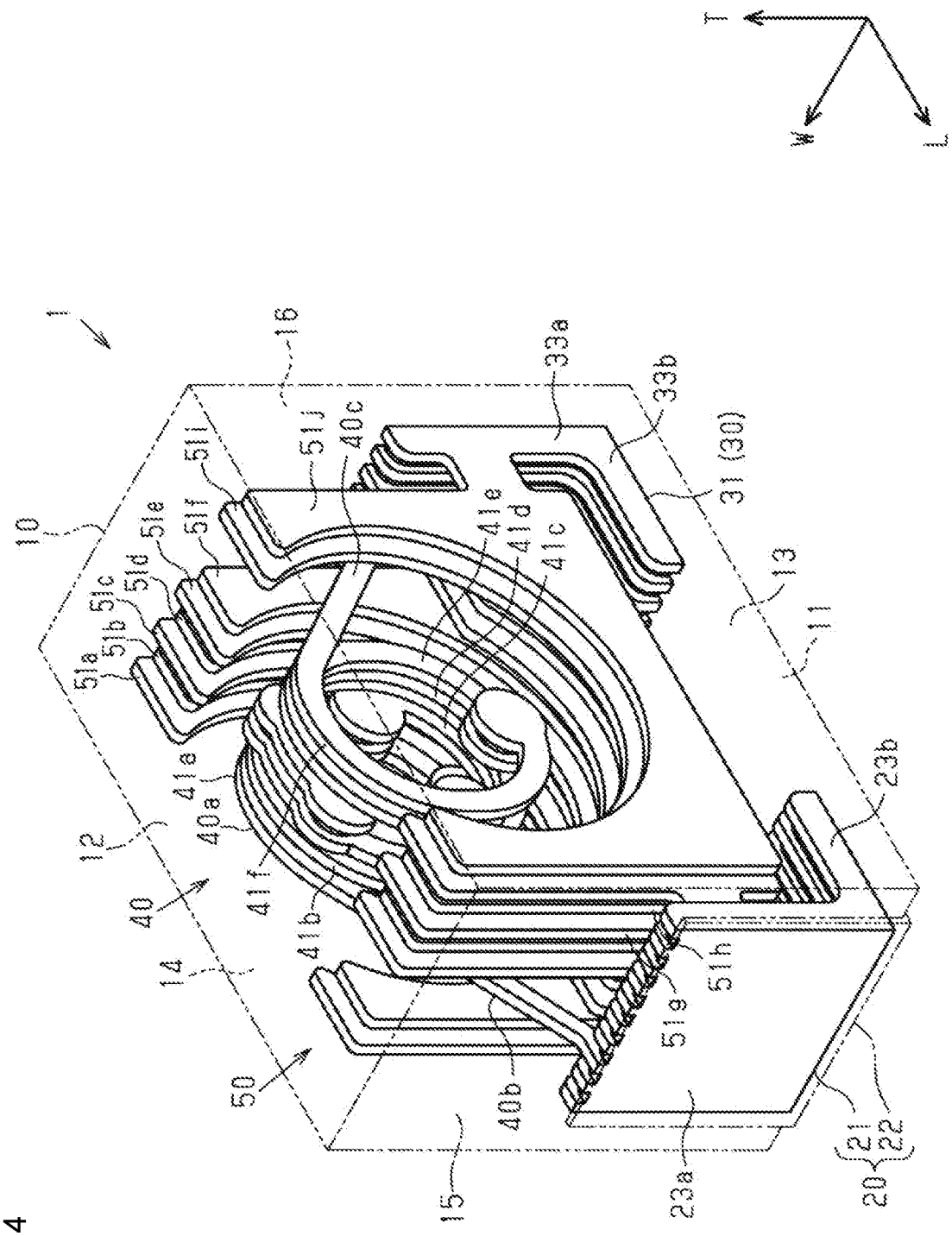
FIG. 4 is a schematic perspective view illustrating the electronic component in a see-through manner.

FIG. 2, FIG. 3, and FIG. 4 are diagrams illustrating the configuration of each component of the electronic component 1 including the internal structure of the electronic component 1. The electronic component 1 further includes a first outer electrode 20, a second outer electrode 30, a coil 40, and a capacitor 50. In FIG. 2, FIG. 3, and FIG. 4, the coil 40, the capacitor 50, and outer terminal electrodes 21 and 31 (described later) of the first and second outer electrodes 20 and 30 that are located in the body 10 are each indicated by a solid line, and the body 10 and covering layers 22 and 32 (described later) of the first and second outer electrodes 20 and 30 that are located outside the body 10 are each indicated by a two-dot chain line, thereby making it easy to understand the inside and the outside of the body 10. In FIG. 2, the coil 40 and the capacitor 50 overlap each other, and thus, a coil portion 40a of the coil 40 is represented by a solid filled area so as to be easily distinguished from the capacitor 50. In addition, an upper end portion (an end portion closest to the upper surface 12) of the capacitor 50 is illustrated by hatching so as to be easily distinguished from the first outer electrode 20 and the second outer electrode 30.

Figure 5:
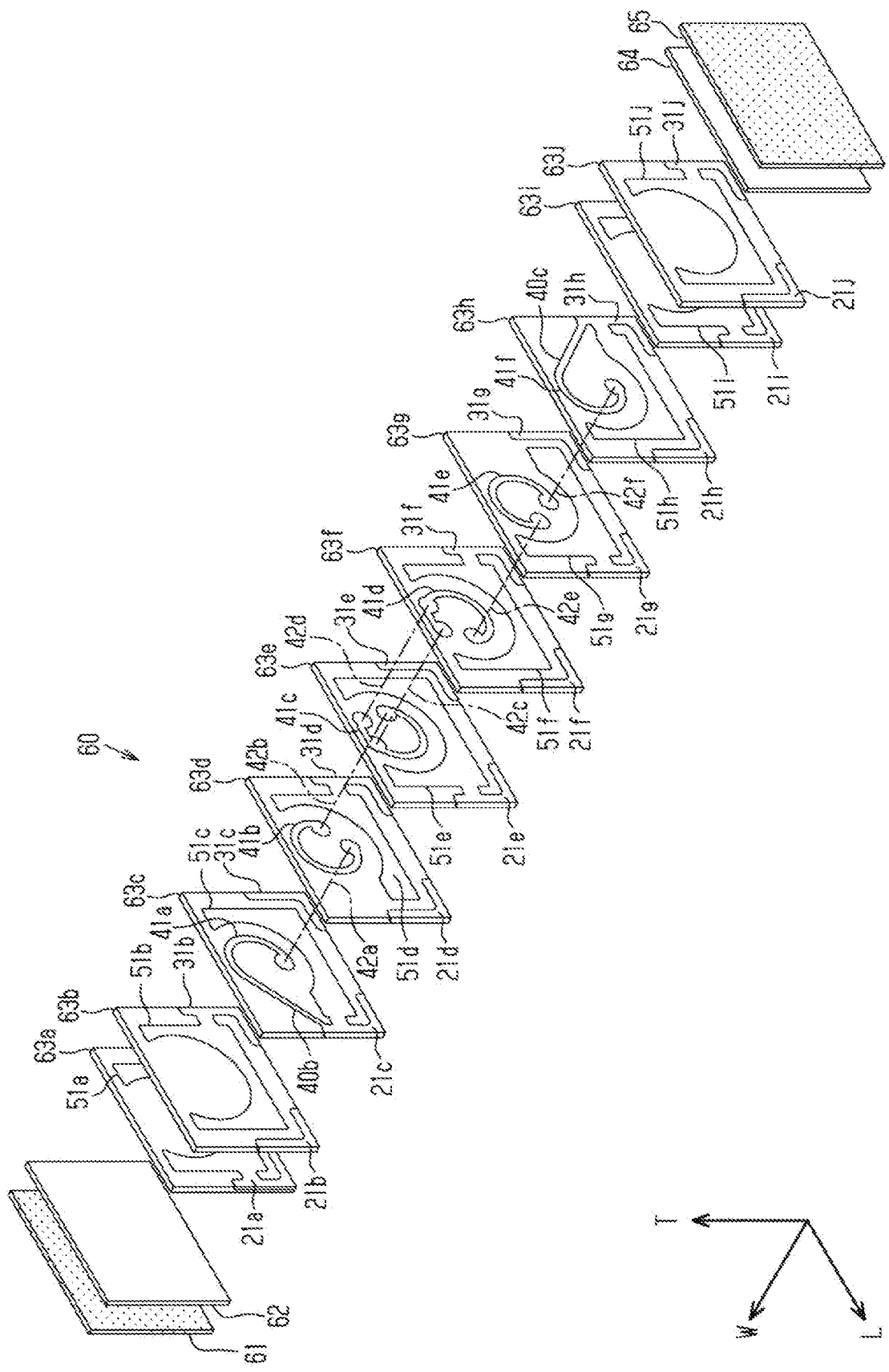
FIG. 5 is an exploded perspective view of the electronic component.

As illustrated in FIG. 5, the body 10 includes a plurality of insulator layers 60 each of which has a main surface parallel to the first side surface 13 and each of which has the shape of a substantially rectangular plate, and the body 10 has a substantially rectangular parallelepiped shape as a result of the plurality of insulator layers 60 being laminated together in the widthwise direction W, which is perpendicular to the first side surface 13. Thus, the widthwise direction W is the lamination direction of the insulator layers 60. The lengthwise direction L and the heightwise direction T, which are perpendicular to the widthwise direction W, are each one of in-layer directions perpendicular to the lamination direction. In order to distinguish the insulator layers from one another, reference signs "61", "62", "63a" to "63j", "64", and "65" are given to the insulator layers. In the following description, when there is no need to distinguish the plurality of insulator layers from one another, the plurality of insulator layers will be denoted by the same reference sign "60", and when there is a need to distinguish the plurality of insulator layers from one another, each of insulator layers will be denoted by one of the reference signs "61", "62", "63a" to "63j", "64", and "65".

Note that there is a case where the main surfaces of the insulator layers 60 are not completely parallel to the first side surface 13 and are slightly inclined after undergoing manufacturing processes such as conductor layer formation, lamination, firing, and curing, and also there is a case where irregularities are formed on the main surfaces of the insulator layers 60 through these manufacturing processes. Even in such cases, the main surfaces of the insulator layers 60 are considered to be substantially parallel to the first side surface 13. In addition, there is a case where the interfaces between the insulator layers 60 are unclear after the insulator layers 60 have undergone the manufacturing processes such as firing and curing.

As a material of the insulator layers 60, for example, a material having a relative permeability of about "2" or smaller is preferable, and for example, a non-magnetic material such as glass (e.g., borosilicate glass), alumina, zirconia, or a polyimide resin can be used. Note that it is preferable that the relative permeability of the material of the insulator layers 60 be close to about "1". However, the insulator layers 60 may be made of a magnetic material depending on the usage of the electronic component 1, and for example, a resin containing ferrite or magnetic powder may be used as the material.

The color of the insulator layers 61 and 65 is different from the color of the other insulator layers 62, 63a to 63j, and 64. In FIG. 1, each of the insulator layers 61 and 65 is illustrated by hatching and indicated by a solid line so as to be distinguished from the other insulator layers. As a result, at the time of mounting the electronic component 1, a situation in which the electronic component 1 has, for example, overturned can be detected.

The first outer electrode 20 and the second outer electrode 30 are input and output terminals for electrical signals that are input to and output from the coil 40 and the capacitor 50 in the electronic component 1, and when the electronic component 1 is mounted onto the circuit board, the first outer electrode 20 and the second outer electrode 30 are to be connected to circuit wiring lines. The first outer electrode 20 is exposed at the mounting surface 11 of the body 10. The first outer electrode 20 is also exposed at the first end surface 15 of the body 10.

Similarly, the second outer electrode 30 is exposed at the mounting surface 11 of the body 10. The second outer electrode 30 is also exposed at the second end surface 16 of the body 10.

Accordingly, the first outer electrode 20 and the second outer electrode 30 are exposed at the mounting surface 11 of the body 10. In other words, the surface of the body 10 at which both the first and second outer electrodes 20 and 30 are exposed is the mounting surface 11.

In the present embodiment, the first outer electrode 20 includes the outer terminal electrode 21 and the covering layer 22. The outer terminal electrode 21 is embedded in the body 10. The outer terminal electrode 21 is formed to have a substantially L-shape when viewed in the widthwise direction W. The outer terminal electrode 21 includes an end-surface electrode 23a that is exposed at the first end surface 15 of the body 10 and a lower-surface electrode 23b that is exposed at the mounting surface 11 of the body 10. The outer terminal electrode 21 has a structure in which the end-surface electrode 23a and the lower-surface electrode 23b are integrated with each other on a ridge line between the first end surface 15 and the mounting surface 11. The covering layer 22 is formed so as to cover the outer terminal electrode 21, which is exposed at the first end surface 15 and the mounting surface 11 of the body 10. Thus, the first outer electrode 20 is exposed only at the surfaces of the body 10 each extending in a direction parallel to the widthwise direction W, and more specifically, the first outer electrode 20 is exposed only at the two surfaces, which are the mounting surface 11 and the first end surface 15.

In the present embodiment, the second outer electrode 30 includes the outer terminal electrode 31 and the covering layer 32. The outer terminal electrode 31 is embedded in the body 10. The outer terminal electrode 31 is formed to have a substantially L-shape when viewed in the widthwise direction W. The outer terminal electrode 31 includes an end-surface electrode 33a that is exposed at the second end surface 16 of the body 10 and a lower-surface 33b that is exposed at the mounting surface 11 of the body 10. The outer terminal electrode 31 has a structure in which the end-surface electrode 33a and the lower-surface 33b are integrated with each other on a ridge line between the second end surface 16 and the mounting surface 11. The covering layer 32 is formed so as to cover the outer terminal electrode 31, which is exposed at the second end surface 16 and the mounting surface 11 of the body 10. Thus, the second outer electrode 30 is exposed only at the surfaces of the body 10 each extending in a direction parallel to the widthwise direction W, and more specifically, the second outer electrode 30 is exposed only at the two surfaces, which are the mounting surface 11 and the second end surface 16.

In the above-described configuration, since the first and second outer electrodes 20 and 30 are exposed only at the surfaces of the body 10 each extending in the direction parallel to the widthwise direction W, a magnetic flux that passes through the center of the coil 40 in the widthwise direction W will not be blocked by the first and second outer electrodes 20 and 30. In addition, when the electronic component 1 is mounted on the circuit board, the above-mentioned magnetic flux becomes parallel to a main surface of the circuit board and is less likely to be blocked by the circuit wiring lines of the circuit board. Therefore, the Q value of the electronic component 1 can be improved.

In particular, the first outer electrode 20 is exposed only at the two surfaces (the first end surface 15 and the mounting surface 11) of the body 10, each of which extends in the direction parallel to the widthwise direction W, and the second outer electrode 30 is exposed only at the two surfaces (the second end surface 16 and the mounting surface 11) of the body 10, each of which extends in the direction parallel to the widthwise direction W, so that a lesser amount of a magnetic flux that passes outside the coil 40 is blocked by the first and second outer electrodes 20 and 30 compared with the case where each of the first and second outer electrodes 20 and 30 is exposed at three or more of the surfaces of the body 10, which in turn results in improvement of the Q value of the electronic component 1. In addition, since the first outer electrode 20 is exposed not only at the mounting surface 11 but also at the first end surface 15, and the second outer electrode 30 is exposed not only at the mounting surface 11 but also at the second end surface 16, the mountability of the electronic component 1 when being mounted onto the circuit board is improved compared with the case where the first and second outer electrodes 20 and 30 are exposed only at the mounting surface 11.

The first outer electrode 20 is formed on the first end surface 15 so as to extend from the mounting surface 11 of the body 10 to a position corresponding to about half of the height dimension T1 of the body 10. The first outer electrode 20 is formed substantially at the center of the body 10 in the widthwise direction W. In the present embodiment, the size (the width dimension) of the first outer electrode 20 in the widthwise direction W is smaller than the width dimension W1 of the body 10. In other words, the first outer electrode 20 is not exposed at the first side surface 13 and the second side surface 14 that are the opposite end surfaces of the body 10 in the widthwise direction W. Note that the width dimension of the first outer electrode 20 may be suitably changed, and for example, the first outer electrode 20 may be formed so as to extend over the entire body 10 in the widthwise direction W and may be exposed at the first side surface 13 and the second side surface 14. In addition, the first outer electrode 20 may be formed so as to be exposed at the mounting surface 11 and so as not to be exposed at the first end surface 15, and vice versa.

The second outer electrode 30 is formed on the second end surface 16 so as to extend from the mounting surface 11 of the body 10 to a position corresponding to about half of the height dimension T1 of the body 10. The second outer electrode 30 is formed substantially at the center of the body 10 in the widthwise direction W. In the present embodiment, the size (the width dimension) of the second outer electrode 30 in the widthwise direction W is smaller than the width dimension W1 of the body 10. In other words, the second outer electrode 30 is not exposed at the first side surface 13 and the second side surface 14, which are the opposite end surfaces of the body 10 in the widthwise direction W. Note that the width dimension of the second outer electrode 30 may be suitably changed, and for example, the second outer electrode 30 may be formed so as to extend over the entire body 10 in the widthwise direction W and may be exposed at the first side surface 13 and the second side surface 14. In addition, the second outer electrode 30 may be formed so as to be exposed at the mounting surface 11 and so as not to be exposed at the second end surface 16, and vice versa.

The size of a portion of each of the first and second outer electrodes 20 and 30 that is exposed at the mounting surface 11 in the lengthwise direction L and the size of a portion of each of the first and second outer electrodes 20 and 30 that is exposed at a corresponding one of the first and second end surfaces 15 and 16 in the heightwise direction T be each about 0.1 mm or larger and about 0.2 mm or smaller (i.e., from about 0.1 mm to about 0.2 mm), and in the present embodiment, each of these sizes is set to, for example, about 0.15 mm.

The outer terminal electrodes 21 and 31 are relatively thick conductive portions each of which enables, with its low electrical resistance and its wide surface area, smooth input and output of electrical signals that are input to and output from the coil 40 and the capacitor 50 and each of which has a relatively large thickness. The outer terminal electrodes 21 and 31 extend through the insulator layers 63a to 63j in the widthwise direction W. The outer terminal electrode 21 includes outer conductor layers 21a to 21j that are laminated together and each of which has the shape of a substantially L-shaped plate when viewed in the widthwise direction W, and the outer terminal electrode 31 includes outer conductor layers 31a to 31j that are laminated together and each of which has the shape of a substantially L-shaped plate when viewed in the widthwise direction W. The outer conductor layers 21a to 21j are provided at a corner at which portions of the insulator layers 63a to 63j corresponding to the mounting surface 11 and portions of the insulator layers 63a to 63j corresponding to the first end surface 15 cross each other. The outer conductor layers 31a to 31j are provided at a corner at which portions of the insulator layers 63a to 63j corresponding to the mounting surface 11 and portions of the insulator layers 63a to 63j corresponding to the second end surface 16 cross each other such that each of the outer conductor layers 31a to 31j and a corresponding one of the outer conductor layers 21a to 21j are symmetric to each other.

Specifically, the outer conductor layers 21a and 31a are located on the main surface of the insulator layer 63a. The outer conductor layers 21b to 21j and 31b to 31j include flat-surface portions each of which is located on one of the main surfaces of the insulator layers 63b to 63j and connecting portions each of which extends through one of the insulator layers 63b to 63j. FIG. 2 illustrates a state where the flat-surface portions and the connecting portions, each of which has a thickness slightly smaller than that of each of the flat-surface portions in the lengthwise direction L, are alternately arranged. The outer conductor layers 21a to 21j are connected to one another by their connecting portions so as to form the outer terminal electrode 21, and the outer conductor layers 31a to 31j are connected to one another by their connecting portions so as to form the outer terminal electrode 31. However, each of the outer terminal electrodes 21 and 31 is not limited to having the above shape, and a configuration in which the outer conductor layers 21a to 21j are connected to one another while their flat-surface portions and their connecting portions have completely the same shape and in which the outer conductor layers 31a to 31j are connected to one another while their flat-surface portions and their connecting portions have completely the same shape may be employed. Alternatively, a configuration in which the outer conductor layers 21a to 21j that do not include the connecting portions and that are not connected to one another are electrically connected to one another by the covering layer 22 and in which the outer conductor layers 31a to 31j that do not include the connecting portions and that are not connected to one another are electrically connected to one another by the covering layer 32 may be employed.

As a material of the outer terminal electrode 21 (the outer conductor layers 21a to 21j), for example, one of metals such as silver (Ag), copper (Cu), and gold (Au) having a low electric resistance or one of electrically conductive materials such as alloys containing these metals as their main components can be used. As a material of the outer terminal electrode 31 (the outer conductor layers 31a to 31j), for example, metals such as silver (Ag), copper (Cu), and gold (Au) having a low electric resistance and electrically conductive materials such as alloys containing these metals as main components may be used.

The covering layers 22 and 32 are relatively thin film-like portions. The covering layer 22 protects the outer terminal electrode 21 and ensures the connection between the outer terminal electrode 21 and the corresponding circuit wiring line of the circuit board, and the covering layer 32 protects the outer terminal electrode 31 and ensures the connection between the outer terminal electrode 31 and the corresponding circuit wiring line of the circuit board. As a material of the covering layers 22 and 32, a material having high solder resistance and high wettability can be used. For example, one of metals such as nickel (Ni), copper (Cu), tin (Sn), and gold (Au) or one of alloys containing these metals can be used. Each of the covering layers 22 and 32 may include a plurality of layers. In the present embodiment, the covering layer 22 has a two-layer structure formed of a Ni-plated layer that covers a portion of the outer terminal electrode 21, the portion being exposed at the body 10, and a Sn-plated layer that covers a surface of the Ni-plated layer, and also the covering layer 32 has a two-layer structure formed of a Ni-plated layer that covers a portion of the outer terminal electrode 31, the portion being exposed at the body 10, and a Sn-plated layer that covers a surface of the Ni-plated layer. It is preferable that the film thickness of the Ni-plated layer be about 3.0 μm or larger and about 9.0 μm or smaller (i.e., from about 3.0 μm to about 9.0 μm), and in the present embodiment, the film thickness of the Ni-plated layer is set to, for example, about 4.5 μm. It is preferable that the film thickness of the Sn-plated layer be about 2.0 μm or larger and about 6.0 μm or smaller (i.e., from about 2.0 μm to about 6.0 μm), and in the present embodiment, the film thickness of the Sn-plated layer is set to, for example, about 3.5 μm. Note that the covering layers 22 and 32 may be omitted. In this case, the outer terminal electrode 21 can serve as the first outer electrode 20, and the outer terminal electrode 31 can serve as the second outer electrode 30.

The coil 40 and the capacitor 50 are elements that perform functions of the electronic component 1, and as illustrated in FIG. 4, the coil 40 and the capacitor 50 are disposed in the body 10. A first end portion of the coil 40 is connected to the first outer electrode 20, and a second end portion of the coil 40 is connected to the second outer electrode 30. The capacitor 50 is electrically connected between the first outer electrode 20 and the second outer electrode 30, that is, the capacitor 50 is electrically connected in parallel to the coil 40. The coil 40 and the capacitor 50 form an LC parallel resonance circuit. When the electronic component 1 is mounted onto the circuit board, the coil 40 and the capacitor 50 are electrically connected to the circuit wiring lines of the circuit board by the first outer electrode 20 and the second outer electrode 30.

As illustrated in FIG. 3, the coil 40 includes the coil portion 40a, a first extended conductor layer 40b, and a second extended conductor layer 40c. The coil portion 40a concentrates a magnetic flux generated by a current, which is input and output to and from the coil 40 through the first outer electrode 20 and the second outer electrode 30, so as to produce a large inductance. The first extended conductor layer 40b electrically connects one of the two end portions of the coil portion 40a and the first outer electrode 20 to each other, and the second extended conductor layer 40c electrically connects the other of the two end portions of the coil portion 40a and the second outer electrode 30 to each other. As illustrated in FIG. 2 and FIG. 4, the coil portion 40a includes a plurality of coil conductor layers 41a to 41f that are arranged in the widthwise direction W in the body 10 and via-conductor layers 42a to 42f that connect the coil conductor layers 41a to 41f to one another in the widthwise direction W.

As illustrated in FIG. 3, when viewed in the widthwise direction W, portions of the coil conductor layers 41a to 41f overlap one another and form a substantially circular path. Accordingly, the coil portion 40a is formed so as to have a substantially circular shape when viewed in the widthwise direction W. Note that the wording "overlap one another" include a case where the portions of the coil conductor layers 41a to 41f are not completely superposed with one another due to, for example, manufacturing tolerances. Note that the shape of the coil portion 40a is not limited to the above-mentioned shape, and for example, the external shape of the coil portion 40a may form a path having any one of the following shapes: a substantially elliptical shape, a substantially rectangular shape, other substantially polygonal shapes, and a shape formed by combining these shapes.

In the coil portion 40a of the present embodiment, a point that is at the lowest position on the inner periphery of the coil portion 40a, that is, a point that is closest to the mounting surface 11 will be referred to as a lowermost point PD. A point that is at the highest position on the inner periphery of the coil portion 40a, that is, a point that is farthest from the mounting surface 11 will be referred to as an uppermost point PU. Note that the inner periphery of the coil portion 40a is the inner periphery of a substantially circular path formed of the plurality of coil conductor layers 41a to 41f overlap one another For example, the inner peripheries (indicated by a dashed line in FIG. 3) of the coil conductor layers 41c and 41d (see FIG. 5), which overlap the coil conductor layer 41f, corresponds to the inner periphery of the coil portion 40a. A point intermediate between the lowermost point PD and the uppermost point PU will be referred to as an intermediate point PC of the coil portion 40a. In the present embodiment, the intermediate point PC of the coil portion 40a is located above the center of the body 10 in the heightwise direction T. In other words, the intermediate point PC of the coil portion 40a is offset upward with respect to the center of the body 10.

The height dimension of the body 10 is denoted by reference sign T1, and the distance from the mounting surface 11 to the intermediate point PC of the coil portion 40a is denoted by reference sign D1. It is preferable that the ratio of the distance D1 to the height dimension T1, which is D1/T1, be, for example, within a range of about 0.51 ≤ D1/T1 ≤ about 0.71. In the case where the ratio D1/T1 is about 0.51 or more, when the electronic component 1 is mounted on the circuit board, a magnetic flux generated by the coil portion 40a is less likely to be blocked by the circuit wiring lines of the circuit board. In the case where the ratio D1/T1 is about 0.71 or less, the inner diameter of the coil portion 40a may easily be ensured, and thus, the L value and the Q value of the coil 40 may easily be ensured.

In the present embodiment, an upper end portion of each of the first outer electrode 20 and the second outer electrode 30 is located at a position corresponding to about half of the height dimension T1 of the body 10 in the heightwise direction T. Thus, in the present embodiment, the intermediate point PC of the coil portion 40a is located above the upper end portions of the first outer electrode 20 and the second outer electrode 30 (or is farther from the mounting surface 11 of the body 10 than the upper end portions of the first outer electrode 20 and the second outer electrode 30 are).

As materials of the coil conductor layers 41a to 41f, the via-conductor layers 42a to 42f, the first extended conductor layer 40b, and the second extended conductor layer 40c of the coil 40, for example, metals such as silver (Ag), copper (Cu), and gold (Au) having a low electric resistance and electrically conductive materials such as alloys containing these metals as their main components can be used.

As illustrated in FIG. 5, the coil conductor layers 41a to 41f are substantially planar conductor layers each of which is wound in less than one turn along one of the main surfaces of the insulator layers 63c to 63h in the body 10. The coil conductor layers 41a to 41f are electrically connected to one another in series by via-conductor layers 42a to 42f that extend through the insulator layers 63d to 63h in the widthwise direction W. Note that, in FIG. 5, each of the via-conductor layers 42a to 42f is indicated by a one-dot chain line. As described above, the plurality of coil conductor layers 41a to 41f, each of which is wound in less than one turn, are electrically connected to one another in series by the via-conductor layers 42a to 42f, so that the coil portion 40a forms a substantially three-dimensional helical shape (a substantially helical shape).

Note that the coil conductor layers 41a to 41f may at least be connected in series to one another as a whole between the first outer electrode 20 and the second outer electrode 30. For example, the coil conductor layers 41c and 41d have parallel portions that are partially connected in parallel to each other, and when a path from an end portion of the coil conductor layer 41c, which is connected to the coil conductor layer 41, to an end portion of the coil conductor layer 41d, which is connected to the coil conductor layer 41e, is viewed, it can be said that the coil conductor layers 41c and 41d are connected in series to each other. Thus, in the coil portion 40a, the plurality of coil conductor layers 41a to 41f are electrically connected to one another in series.

The first extended conductor layer 40b has a shape extending substantially linearly on the main surface of the insulator layer 63c in the body 10 and electrically connects the coil conductor layer 41a, which is located on a first end side of the coil portion 40a, and the outer conductor layer 21c of the first outer electrode 20, which is in the same layer as the coil conductor layer 41a, to each other. In the present embodiment, the first extended conductor layer 40b has a shape extending substantially linearly from a position in the vicinity of an upper portion of the main surface of the insulator layer 63c and in the vicinity of an upper portion of the substantially circular path of the coil portion 40a toward the upper end of the outer conductor layer 21c. The second extended conductor layer 40c has a shape extending substantially linearly on the main surface of the insulator layer 63h in the body 10 and electrically connects the coil conductor layer 41f, which is located on a second end side of the coil portion 40a, and the outer conductor layer 31h of the second outer electrode 30, which is in the same layer as the coil conductor layer 41f, to each other. In the present embodiment, the second extended conductor layer 40c has a shape extending substantially linearly from a position in the vicinity of an upper portion of the main surface of the insulator layer 63h and in the vicinity of an upper portion of the substantially circular path of the coil portion 40a toward the upper end of the outer conductor layer 31h.

As illustrated in FIG. 3, the capacitor 50 is disposed between at least the mounting surface 11 of the body 10 and the coil 40. In the present embodiment, the capacitor 50 is disposed between the mounting surface 11 of the body 10 and the first end surface 15 and between the second end surface 16 and the coil 40.

The capacitor 50 includes a first capacitance portion 50a that is disposed between the mounting surface 11 of the body 10 and the coil 40, a second capacitance portion 50b that is disposed between the first end surface 15 of the body 10 and the coil 40, and a third capacitance portion 50c that is disposed between the second end surface 16 of the body 10 and the coil 40. Accordingly, the capacitor 50 does not overlap the coil portion 40a when viewed in the widthwise direction W. Thus, the capacitor 50 does not block a magnetic flux that is generated by the coil portion 40a, so that the inductance (the L value) of the coil 40 can be obtained with improved efficiency, and decrease in the Q value of the coil 40 can be suppressed. Note that, in the capacitor 50 of the present embodiment, the first capacitance portion 50a, the second capacitance portion 50b, and the third capacitance portion 50c are integrated with one another and are not clearly distinguished from one another.

As illustrated in FIG. 5, the capacitor 50 includes a plurality of capacitor conductor layers 51a to 51j that are disposed in the body 10 and each of which is formed in a substantially plate-like shape extending on the main surface of one of the insulator layers 63a to 63j.

The capacitor conductor layer 51a is connected to the outer conductor layer 21a on the main surface of the insulator layer 63a. The capacitor conductor layer 51a has a substantially U-shape formed by cutting out a portion of a rectangle into a substantially ring-like shape. More specifically, when viewed in the widthwise direction W, the capacitor conductor layer 51a is shaped so as to follow the substantially circular shape of the coil portion 40a with a fixed gap between the capacitor conductor layer 51a and the coil portion 40a. In other words, the capacitor conductor layer 51a has a shape along the coil portion 40a with a fixed gap and includes portions corresponding to the first capacitance portion 50a, the second capacitance portion 50b, and the third capacitance portion 50c. In addition, the capacitor conductor layer 51a is shaped so as to follow the shapes of the outer conductor layers 21a and 31a that are in the same layer as the capacitor conductor layer 51a with a fixed gap between the capacitor conductor layer 51a and each of the outer conductor layers 21a and 31a. In other words, the capacitor conductor layer 51a has a shape along the outer conductor layers 21a and 31a with a fixed gap.

The capacitor conductor layer 51b is connected to the outer conductor layer 31b on the main surface of the insulator layer 63b. Similar to the capacitor conductor layer 51a, the capacitor conductor layer 51b excluding portion thereof that is connected to the outer conductor layer 31b has a substantially U-shape. Thus, the capacitor conductor layer 51b includes portions corresponding to the first capacitance portion 50a, the second capacitance portion 50b, and the third capacitance portion 50c. In addition, when viewed in the widthwise direction W, the capacitor conductor layer 51b is shaped so as to follow the substantially circular shape of the coil portion 40a with a fixed gap between the capacitor conductor layer 51b and the coil portion 40a and is shaped so as to follow the shapes of the outer conductor layers 21b and 31b that are in the same layer as the capacitor conductor layer 51b with a fixed gap between the capacitor conductor layer 51b and each of the outer conductor layers 21b and 31b.

The capacitor conductor layer 51c is connected to the outer conductor layer 21c on the main surface of the insulator layer 63c. The capacitor conductor layer 51c is not in contact with the first extended conductor layer 40b of the coil 40, which is in the same layer as the capacitor conductor layer 51c, and has a substantially L-shape extending along two sides that meet at a corner where the outer conductor layer 31c is formed. Thus, the capacitor conductor layer 51c includes portions corresponding to the first capacitance portion 50a and the third capacitance portion 50c and does not include a portion corresponding to the second capacitance portion 50b. In addition, the capacitor conductor layer 51c is shaped so as to follow the shapes of the coil conductor layer 41a and the outer conductor layers 21c and 31c each of which is in the same layer as the capacitor conductor layer 51c with a fixed gap therebetween.

The capacitor conductor layer 51d is connected to the outer conductor layer 31d on the main surface of the insulator layer 63d. Similar to the capacitor conductor layer 51c, the capacitor conductor layer 51d excluding portions thereof that are connected to the outer conductor layers 21c and 31d has a substantially L-shape. In other words, the capacitor conductor layer 51d does not overlap the first extended conductor layer 40b when viewed in the widthwise direction W. The capacitor conductor layer 51d includes portions corresponding to the first capacitance portion 50a and the third capacitance portion 50c and does not include a portion corresponding to the second capacitance portion 50b. In addition, the capacitor conductor layer 51d is shaped so as to follow the shapes of the coil conductor layer 41b and the outer conductor layers 21d and 31d each of which is in the same layer as the capacitor conductor layer 51d with a fixed gap therebetween.

The capacitor conductor layer 51e is connected to the outer conductor layer 21e on the main surface of the insulator layer 63e. Similar to the capacitor conductor layer 51a, the capacitor conductor layer 51e is substantially U-shaped. Thus, the capacitor conductor layer 51e includes portions corresponding to the first capacitance portion 50a, the second capacitance portion 50b, and the third capacitance portion 50c. In addition, the capacitor conductor layer 51e is shaped so as to follow the shapes of the coil conductor layer 41c and the outer conductor layers 21e and 31e each of which is in the same layer as the capacitor conductor layer 51e with a fixed gap therebetween.

The capacitor conductor layer 51f is connected to the outer conductor layer 31f on the main surface of the insulator layer 63f. Similar to the capacitor conductor layer 51b, the capacitor conductor layer 51f is substantially U-shaped. Thus, the capacitor conductor layer 51f includes portions corresponding to the first capacitance portion 50a, the second capacitance portion 50b, and the third capacitance portion 50c. In addition, the capacitor conductor layer 51f is shaped so as to follow the shapes of the coil conductor layer 41d and the outer conductor layers 21f and 31f each of which is in the same layer as the capacitor conductor layer 51f with a fixed gap therebetween.

The capacitor conductor layer 51g is connected to the outer conductor layer 21g on the main surface of the insulator layer 63g. The capacitor conductor layer 51g has a substantially L-shape extending along two sides that meet at a corner where the outer conductor layer 21g is formed. When viewed in the widthwise direction W, the capacitor conductor layer 51g does not overlap the second extended conductor layer 40c of the insulator layer 63h, which will be described later. The capacitor conductor layer 51g includes portions corresponding to the first capacitance portion 50a and the second capacitance portion 50b and does not include a portion corresponding to the third capacitance portion 50c. In addition, the capacitor conductor layer 51g is shaped so as to follow the shapes of the coil conductor layer 41e and the outer conductor layers 21g and 31g each of which is in the same layer as the capacitor conductor layer 51g with a fixed gap therebetween.

The capacitor conductor layer 51h is connected to the outer conductor layer 31h on the main surface of the insulator layer 63h. The capacitor conductor layer 51h is not in contact with the second extended conductor layer 40c, which is formed on the insulator layer 63h, and has a substantially L-shape extending along two sides that meet at a corner where the outer conductor layer 21h is formed. Thus, the capacitor conductor layer 51h includes portions corresponding to the first capacitance portion 50a and the second capacitance portion 50b and does not include a portion corresponding to the third capacitance portion 50c. In addition, the capacitor conductor layer 51h is shaped so as to follow the shapes of the coil conductor layer 41f and the outer conductor layers 21h and 31h each of which is in the same layer as the capacitor conductor layer 51h with a fixed gap therebetween.

The capacitor conductor layer 51i is connected to the outer conductor layer 21i on the main surface of the insulator layer 63i, and the capacitor conductor layer 51j is connected to the outer conductor layer 31j on the main surface of the insulator layer 63j. Similar to the capacitor conductor layers 51a and 51b, each of the capacitor conductor layers 51i and 51j is substantially U-shaped. Thus, each of the capacitor conductor layers 51i and 51j includes portions corresponding to the first capacitance portion 50a, the second capacitance portion 50b, and the third capacitance portion 50c. In addition, when viewed in the widthwise direction W, each of the capacitor conductor layers 51i and 51j is shaped so as to follow the substantially circular shape of the coil portion 40a with a fixed gap between the coil portion 40a and each of the capacitor conductor layers 51i and 51j. In addition, the capacitor conductor layer 51i is shaped so as to follow the shapes of the outer conductor layers 21i and 31i that are in the same layer as the capacitor conductor layer 51i with a fixed gap between the capacitor conductor layer 51i and each of the outer conductor layers 21i and 31i, and the capacitor conductor layer 51j is shaped so as to follow the shapes of the outer conductor layers 21j and 31j that are in the same layer as the capacitor conductor layer 51j with a fixed gap between the capacitor conductor layer 51j and each of the outer conductor layers 21j and 31j.

As described above, the plurality of capacitor conductor layers 51a to 51j are each electrically connected to one of the first outer electrode 20 and the second outer electrode 30, and the capacitor conductor layers 51a, 51c, 51e, 51g, and 51i, which are connected to the first outer electrode 20, and the capacitor conductor layers 51b, 51d, 51f, 51h, and 51j, which are connected to the second outer electrode 30, are alternately arranged along the widthwise direction W. As a result, the capacitor 50 includes a plurality of capacitors that are electrically connected in parallel to one another between the first outer electrode 20 and the second outer electrode 30.

As a material of the capacitor conductor layers 51a to 51j, for example, one of metals such as silver (Ag), copper (Cu), and gold (Au) having a low electric resistance or one of electrically conductive materials such as alloys containing these metals as main their components can be used.

Here, as illustrated in FIG. 2 and FIG. 3, in the capacitor conductor layers 51c and 51d that are adjacent to each other in the widthwise direction W in the electronic component 1, the shortest distance between the coil conductor layer 41b and the capacitor conductor layer 51d, which are in the same layer, is larger than the shortest distance between the coil conductor layer 41a and the capacitor conductor layer 51c, which are in the same layer.

In the electronic component 1, in addition to the relationship between the above-mentioned shortest distances, the fixed gap (a first gap) between a portion of the capacitor conductor layer 51d, the portion being shaped so as to follow the shape of the coil conductor layer 41b, and the coil conductor layer 41b is larger than the fixed gap (a second gap) between a portion of the capacitor conductor layer 51c, the portion being shaped so as to follow the shape of the coil conductor layer 41a, and the coil conductor layer 41a.

As illustrated in FIG. 2, in the electronic component 1, the relationship between the above-mentioned shortest distances and the relationship between the above-mentioned fixed gaps are satisfied by the capacitor conductor layer 51c and the capacitor conductor layer 51d, and in addition, similar relationships are satisfied by any two of the capacitor conductor layers 51c to 51h, which are respectively in the same layers as the coil conductor layers 41a to 41f, the two capacitor conductor layers being adjacent to each other in the widthwise direction W. In particular, the capacitor conductor layers 51c to 51h, which are respectively in the same layers as the coil conductor layers 41a to 41f, are each shaped so as to follow the shape of a corresponding one of the coil conductor layers 41a to 41f with a fixed gap therebetween such that these fixed gaps between the capacitor conductor layers 51c to 51h and the coil conductor layers 41a to 41f each correspond to one of the above-mentioned first and second gaps and such that the first gaps and the second gaps are alternately present in the widthwise direction W.

Note that the difference between the above-mentioned shortest distances and the difference between the above-mentioned fixed gaps are each, for example, about 5 μm.

It is preferable that the width of each of the coil conductor layers 41a to 41f be, for example, about 12 μm or larger and about 20 μm or smaller (i.e., from about 12 μm to about 20 μm). For example, the width is about 16 μm. It is preferable that the thickness of each of the coil conductor layers 41a to 41f be, for example, about 6 μm or larger and about 10 μm or smaller (i.e., from about 6 μm to about 10 μm). For example, the thickness is about 16 μm. It is preferable that the thickness of the insulator layer be, for example, about 5.5 μm or larger and about 11 μm or smaller (i.e., from about 5.5 μm to about 11 μm). For example, the thickness of the insulator layer is about 8 μm. Note that the thickness of the insulator layer mentioned above is, for example, the thickness of one of the insulator layers 60 that is sandwiched between the coil conductor layer 41a and the coil conductor layer 41b illustrated in FIG. 2. It is preferable that a coil length of the coil 40 (the length of the coil portion 40a from the lower end to the upper end thereof in the widthwise direction W in FIG. 2) be, for example, about 80 μm or larger and about 85 μm or smaller (i.e., from about 80 μm to about 85 μm). For example, the coil length of the coil 40 is about 82 μm.

It is preferable that the area of a facing surface of the capacitor 50 be, for example, about 0.01 mm$^2$ or larger and about 0.4 mm$^2$ or smaller (i.e., from about 0.01 mm$^2$ to about 0.4 mm$^2$). For example, the area of the facing surface of the capacitor 50 is about 0.25 mm$^2$.

It is preferable that the thickness of the outermost layer such as the insulator layers 61, 65 be, for example, about 27.5 μm or larger and about 32.5 μm or smaller (i.e., from about 27.5 μm to about 32.5 μm). For example, the thickness of the outermost layer of the capacitor 50 is about 30 μm. It is preferable that a side gap be, for example, about 20 μm or larger and about 50 μm or smaller (i.e., from about 20 μm to about 50 μm). For example, the side gap is about 35 μm. Note that the term "side gap" refers to the distance from the outermost point of the inner conductors (the coil conductor layers 41a to 41f and the capacitor conductor layers 51a to 51j) to the outer periphery of the insulator layers 60 (e.g., the upper surface 12 of the body 10).

As illustrated in FIG. 2, FIG. 3, and FIG. 5, the coil portion 40a and the first and second extended conductor layers 40b and 40c each have a symmetrical (180-degree rotation) structure with respect to an axis that is perpendicular to the mounting surface 11. Thus, even if the connection relationship between the first and second outer electrodes 20 and 30 and substrate wiring lines to which the first and second outer electrodes 20 and 30 are connected are reversed, similar characteristics may be obtained.

(Manufacturing Method)

A method of manufacturing the above-described electronic component 1 will now be described with reference to FIG. 5.

First, a mother insulator layer is formed. The mother insulator layer is an insulator layer including portions that will serve as a plurality of bodies 10 and that are arranged in a matrix and connected to one another. More specifically, a plurality of insulating sheets (green sheets) each of which is obtained by, for example, applying an insulating paste that contains borosilicate glass as a main component onto a film by screen printing are prepared.

Next, a conductive paste including the above-mentioned electrically conductive material used in the coil 40 is applied, by screen printing, to portions of the above-mentioned insulating sheets on which the outer conductor layers 21a to 21i and 31a to 31j, the capacitor conductor layers Ma to 51j, the coil conductor layers 41a to 41f, and the via-conductor layers 42a to 42f, which are illustrated in FIG. 5, are to be formed. Specifically, the conductive paste is applied to portions of a main surface of one of the insulating sheets, the insulating sheet forming the insulator layer 63a illustrated in FIG. 5. The outer conductor layers 21a and 31a and the capacitor conductor layer 51a are to be formed on the portions of the main surface of the insulating sheet. Through holes are formed, by using laser or the like, in portions of one of the insulating sheets, the insulating sheet forming the insulator layer 63b. The outer conductor layers 21b and 31b are to be formed at the portions of the insulating sheet. The conductive paste is applied to the through holes and to portions of a main surface of the insulating sheet on which the outer conductor layers 21b and 31b and the capacitor conductor layer 51b are to be formed. Through holes are formed in portions of one of the insulating sheets, the insulating sheet forming the insulator layer 63c. The outer conductor layers 21c and 31c are to be formed at the portions of the insulating sheet. The conductive paste is applied to the through holes and to portions of a main surface of the insulating sheet on which the outer conductor layers 21c and 31c, the coil conductor layer 41a, and the capacitor conductor layer 51c are to be formed. Through holes are formed in portions of the insulating sheets that form the insulator layers 63d to 63h, and the outer conductor layers 21d to 21h and 31d to 31h and the via-conductor layers 42a to 42f are to be formed at the portions of the insulating sheets. The conductive paste is applied to the through holes and to portions of main surfaces of the insulating sheets on which the outer conductor layers 21d to 21h and 31d to 31h, the coil conductor layers 41b to 41f, the capacitor conductor layers 51d to 51h, and the via-conductor layers 42a to 42f are to be formed. Through holes are formed in portions of the insulating sheets that form the insulator layers 63i and 63j, and the outer conductor layers 21i, 21j, 31i, and 31j are to be formed portions of the insulating sheets. The conductive paste is applied to the through holes and to portions of main surfaces of the insulating sheets on which the outer conductor layers 21i, 21j, 31i, and 31j and the capacitor conductor layers 51i and 51j are to be formed. The insulating sheets to which the electrically conductive paste has been applied in the manner described above and the insulating sheets that form the insulator layers 61, 62, 64, and 65 are laminated together and then press-bonded together, so that the mother insulator layer is formed.

Next, the mother insulator layer is cut with a dicing machine, a guillotine cutter, or the like and is singulated into the insulator layers each of which will serve as the body 10. In addition, the singulated insulator layers are fired in a firing furnace or the like, so that the bodies 10 in each of which the outer conductor layers 21a to 21j and 31a to 31j, the coil conductor layers 41a to 41f, the capacitor conductor layers 51a to 51j, and the via-conductor layers 42a to 42f have been embedded are formed. Note that, considering shrinkage of the insulator layers that occurs at the time of firing, the mother insulator layer is cut such that the singulated insulator layers each have a size larger than that of the body 10.

Next, barrel finishing is performed on the above-described body 10 such that the corners of the body 10 are round-chamfered. In this case, the covering layers 22 and 32 are formed on the corresponding surfaces of the body 10 by performing barrel plating in the order of nickel, copper, and tin, and the first and second outer electrodes 20 and 30 are formed, so that manufacture of the electronic component 1 is completed.

Note that the above-described manufacturing method is an example, and any other commonly known manufacturing method may be used instead of the above-described manufacturing method, or any other commonly known manufacturing method may be performed in addition to the above-described manufacturing method as long as the structure of the electronic component 1 can be fabricated.

(Operation)

Operation of the above-described electronic component 1 will now be described.

As described above, the electronic component 1 includes the body 10, which has the first side surface 13, the plurality of coil conductor layers 41a to 41f, which are wound along the corresponding main surfaces parallel to the first side surface 13 in the body 10, and the plurality of capacitor conductor layers 51a to 51j, which are disposed in the body 10 and each of which has a substantially plate-like shape parallel to the first side surface 13. The plurality of coil conductor layers 41a to 41f and the plurality of capacitor conductor layers 51a to 51j are arranged in the widthwise direction W (the lamination direction), which is perpendicular to the first side surface 13. The plurality of capacitor conductor layers 51a to 51j include the capacitor conductor layer 51d (an example of a first capacitor conductor layer) and the capacitor conductor layer 51c (an example of a second capacitor conductor layer) that are adjacent to each other in the widthwise direction W. The plurality of coil conductor layers 41a to 41f include the coil conductor layer 41b (an example of a first coil conductor layer), which is in the same layer as the capacitor conductor layer 51d, and the coil conductor layer 41a (an example of a second coil conductor layer), which is in the same layer as the capacitor conductor layer 51c. The shortest distance between the coil conductor layer 41b and the capacitor conductor layer 51d is larger than the shortest distance between the coil conductor layer 41a and the capacitor conductor layer 51c.

With this configuration, as illustrated in FIG. 2 to FIG. 4, an end portion of the capacitor conductor layer 51c, the end portion being located on the side on which the coil conductor layer 41a is present, does not overlap the capacitor conductor layer 51d when viewed in the widthwise direction W. Thus, for example, even if a formation position of the end portion of the capacitor conductor layer 51c, which is located on the side on which the coil conductor layer 41a is present, is deviated through a manufacturing process, only the position of a portion of the capacitor conductor layer 51c that has not faced the capacitor conductor layer 51d changes, and consequently, the influence of this positional deviation on the capacitance value generated between the capacitor conductor layer 51c and the capacitor conductor layer 51d is small. Therefore, with this configuration, occurrence of variations in the capacitance value between the capacitor conductor layers 51c and 51d, which face each other in the widthwise direction W, can be suppressed.

In the electronic component 1, the capacitor conductor layer 51d is shaped so as to follow the shape of the coil conductor layer 41b with the fixed first gap therebetween, and the capacitor conductor layer 51c is shaped so as to follow the shape of the coil conductor layer 41a with the fixed second gap therebetween. The first gap is larger than the second gap.

With this configuration, as illustrated in FIG. 2 to FIG. 4, the portion of the capacitor conductor layer 51c that is shaped so as to follow the shape of the coil conductor layer 41a does not overlap the capacitor conductor layer 51d when viewed in the widthwise direction W. Thus, for a reason similar to that in the above-mentioned relationship between the shortest distances, occurrence of variations in the capacitance value between the capacitor conductor layers 51c and 51d, which face each other in the widthwise direction W, can be further suppressed.

In addition, in the electronic component 1, each of the plurality of coil conductor layers 41a to 41f is in the same layer as a corresponding one of the plurality of capacitor conductor layers 51c to 51h, and the capacitor conductor layers 51c to 51h, each of which is in the same layer as a corresponding one of the coil conductor layers 41a to 41f, are each shaped so as to follow the shape of the corresponding one of the coil conductor layers 41a to 41f with a fixed gap therebetween such that these fixed gaps between the capacitor conductor layers 51c to 51h and the coil conductor layers 41a to 41f each correspond to one of the above-mentioned first and second gaps and such that the first gaps and the second gaps are alternately present in the widthwise direction W.

With this configuration, not only the portion of the capacitor conductor layer 51c that is shaped so as to follow the shape of the coil conductor layer 41a but also portions of the capacitor conductor layers 51e and 51g, the portions being respectively shaped so as to follow the shapes of the coil conductor layers 41c and 41e, do not overlap the capacitor conductor layers 51d, 51f, and 51h when viewed in the widthwise direction W. Thus, for a reason similar to that mentioned above, occurrence of variations in the capacitance value between the capacitor conductor layers 51d to 51h, which face one another in the widthwise direction W, can be suppressed.

As a result, in the electronic component 1, occurrence of variations in the capacitance value can be suppressed.

Note that, in the electronic component 1, the capacitance value affects a resonant frequency of an LC resonance circuit including the coil 40 and the capacitor 50. Therefore, in the electronic component 1, by suppressing the occurrence of variations in the capacitance value in the manner described above, occurrence of variations in the resonant frequency can be suppressed.

A predetermined number n (e.g., n=500) of the electronic components 1 of the present embodiment each having the above-described configuration and the predetermined number n of electronic components each of which is a comparative example were fabricated, and the characteristics of the electronic components 1 and the electronic components of the comparative example were measured. In each of the electronic components of the comparative example, the coil conductor layers 41a to 41f are each spaced apart, by the same distance, from a corresponding one of the capacitor conductor layers 51c to 51h, which is in the same layer as the coil conductor layer.

In the above-described embodiment and the comparative example, each of the coils 40 was set so as to exhibit an inductance (L value) of 2.7 nH and a Q value of 14.0 with respect to an input signal at a frequency of 500 MHz. Similarly, in the above-described embodiment and the comparative example, each of the capacitors 50 was set so as to exhibit a capacitance C of 1.58 pF with respect to an input signal at a frequency of 500 MHz. In this case, in the present embodiment, the variations of a resonant frequency were in a range of ±54 MHz with respect to the resonant frequency f0 of 2.4 GHz, which is a target value. In contrast, in the comparative example, the variations of a resonant frequency were in a range of ±130 MHz with respect to the resonant frequency f0 of 2.4 GHz, which is a target value. Therefore, according to the above-described configuration of the electronic component 1, variations in the characteristics (including the resonant frequency) can be reduced.

In the electronic component 1, as illustrated in FIG. 5, the coil conductor layers 41a to 41f include the parallel portions, which are portions of the coil conductor layers 41c and 41d that are electrically connected in parallel to each other, between the via-conductor layer 42c and the via-conductor layer 42d. Such parallel portions can reduce the electric resistance of the coil 40 and can improve the Q value of the coil 40, that is, the Q characteristic of the LC resonance circuit.

In addition, in the electronic component 1, as illustrated in FIG. 3 and FIG. 5, each of the capacitor conductor layers 51a to 51j of the capacitor 50 has a substantially rectangular external shape and is cut away so as not to overlap the coil conductor layers 41a to 41f. The capacitor conductor layers 51a to 51j are shaped so as to follow the shapes of the first outer electrode 20 and the second outer electrode 30 such that there are fixed third gaps between the capacitor conductor layers 51a to 51j and the first and second outer electrodes 20 and 30. Thus, capacitance can be generated also between the first and second outer electrodes 20 and 30 and the capacitor conductor layers 51a to 51j, and the capacitance value can be obtained with improved efficiency. Therefore, the resonant frequency can be shifted further toward the low-frequency side with respect to the predetermined external dimensions of the electronic component 1, and the design range of the electronic component 1 can be increased.

In the electronic component 1, as illustrated in FIG. 2 to FIG. 4, each of the above-mentioned third gaps between the capacitor conductor layers 51b, 51d, 51f, 51h, and 51j and the first and second outer electrodes 20 and 30 is larger than each of the above-mentioned third gap between each of the capacitor conductor layers Ma, 51c, 51e, 51g, and 51i and the first and second outer electrodes 20 and 30. With this configuration, in the electronic component 1, occurrence of variations in the capacitance value can be further suppressed.

In addition, in the electronic component 1, as illustrated in FIG. 5, the number of times each of the coil conductor layers 41a to 41f is wound (the number of turns of each of the coil conductor layers 41a to 41f) is less than one turn, and each of the coil conductor layers 41a to 41f has a shape formed by cutting out a portion of a ring. Each of the coil conductor layers 41a to 41f is connected, at a cutout portion between the two end portions thereof, to one of the coil conductor layers 41a to 41f that is in a different layer therefrom. In other words, the cutout portion serves as a switching portion that switches the coil conductor layers. The cutout portion of each of the coil conductor layers 41a to 41f faces a corresponding one of the capacitor conductor layers 51c to 51h that is in the same layer as the coil conductor layer. In this case, in the body 10, the cutout portions of the coil conductor layers 41a to 41f are not located on the side on which the capacitor conductor layers 51a to 51j are not arranged and on which the upper surface 12 is present. Consequently, unevenness in the arrangement of the conductor layers in the body 10 can be reduced, and thus, variations in thermal stress in the body 10 can be reduced. Variations in the above-mentioned thermal stress affects the reliability of the electronic component 1, and accordingly, with the above-described configuration, the reliability of the electronic component 1 can be improved.

The electronic component 1 is mounted onto the circuit board while the mounting surface 11 of the body 10, at which the first outer electrode 20 and the second outer electrode 30 are exposed, faces the circuit board. The coil 40 is a substantially helical coil formed by connecting in series the plurality of coil conductor layers 41a to 41f that are arranged in the direction perpendicular to the first and second side surfaces 13 and 14, which are perpendicular to the mounting surface 11, to one another. Accordingly, the coil axis of the coil 40 is parallel to the circuit board on which the electronic component 1 has been mounted. Thus, a magnetic flux generated by the coil 40 is less likely to be blocked by the circuit wiring lines of the circuit board. Therefore, the inductance (L value) of the coil 40 can be obtained with improved efficiency, and decrease in the Q values of the coil 40 and the electronic component 1 is suppressed.

In the electronic component 1, the first outer electrode 20, the coil 40 (the first extended conductor layer 40b, the plurality of coil conductor layers 41a to 41f, and the second extended conductor layer 40c), and the second outer electrode 30 are electrically connected to one another in series in this order, and each of the capacitor conductor layers 51a to 51j is electrically connected to one of the first outer electrode 20 and the second outer electrode 30. The capacitor conductor layers 51a, 51c, 51e, 51g, and 51i that are connected to the first outer electrode 20 and the capacitor conductor layers 51b, 51d, 51f, 51h, and 51j that are connected to the second outer electrode 30 are alternately arranged along the widthwise direction W. With this configuration, a parallel LC resonance circuit can be formed between the first outer electrode 20 and the second outer electrode 30.

In the electronic component 1, the mounting surface 11, the capacitor conductor layers 51c to 51h, and the coil conductor layers 41a to 41f are arranged in this order in the heightwise direction T, which is perpendicular to the mounting surface 11. With this configuration, the coil 40 is relatively far from the circuit board (circuit wiring lines), and the capacitor 50 is relatively close to the circuit board (circuit wiring lines), and the Q value of the coil 40 and the capacitance value of the capacitor 50 can both be improved, which in turn results in improvement of the characteristics of the electronic component 1.

In the electronic component 1, only the first outer electrode 20 is exposed at the first end surface 15, and only the second outer electrode 30 is exposed at the second end surface 16. With this configuration, the first outer electrode 20 and the second outer electrode 30 are respectively exposed at the first end surface 15 and the second end surface 16, which are perpendicular to the circuit board, and since mounting solder forms a fillet at the time of mounting the electronic component 1, the mountability of the electronic component 1 when being mounted onto the circuit board can be improved.

In the electronic component 1, as illustrated in FIG. 5, the capacitor conductor layers 51a to 51j include the capacitor conductor layer 51c, which is in the same layer as the first extended conductor layer 40b, and the capacitor conductor layer 51d (an example of a fourth capacitor conductor layer), which is adjacent to the capacitor conductor layer 51c (an example of a third capacitor conductor layer) in the widthwise direction W. In addition, when viewed in the widthwise direction W, the capacitor conductor layer 51d does not overlap the capacitor conductor layer 51c. The line width of the first extended conductor layer 40b is small (e.g., about 15 µm), and thus, the capacitance value obtained by the capacitor conductor layer 51d that overlaps the first extended conductor layer 40b is likely to vary. Thus, by forming the capacitor conductor layer 51d such that the capacitor conductor layer 51d does not overlap the first extended conductor layer 40b, occurrence of variations in the capacitance value can be suppressed. The same applies to the second extended conductor layer 40c and the capacitor conductor layer 51g as illustrated in FIG. 5.

As described above, according to the present embodiment, the following advantageous effects can be obtained.

(1) The electronic component 1 includes the body 10, which has the first side surface 13, the coil conductor layers 41a to 41f, which are wound along the corresponding main surfaces parallel to the first side surface 13, and the capacitor conductor layers 51a to 51j, each of which is parallel to the first side surface 13 and each of which has a substantially plate-like shape. The coil conductor layers 41a to 41f and the capacitor conductor layers 51a to 51j are arranged in the widthwise direction W, which is perpendicular to the first side surface 13. The capacitor conductor layers 51a to 51j include the capacitor conductor layer 51d and the capacitor conductor layer 51c that are adjacent to each other in the widthwise direction W. The coil conductor layers 41a to 41f include the coil conductor layer 41b, which is in the same layer as the capacitor conductor layer 51d, and the coil conductor layer 41a, which is in the same layer as the capacitor conductor layer 51c. The shortest distance between the coil conductor layer 41b and the capacitor conductor layer 51d is larger than the shortest distance between the coil conductor layer 41a and the capacitor conductor layer 51c. As a result, occurrence of variations in the capacitance value between the capacitor conductor layers 51c and 51d, which face each other in the widthwise direction W, can be suppressed. In the electronic component 1, the capacitance value affects the resonant frequency of the LC resonance circuit including the coil 40 and the capacitor 50.

(2) In the electronic component 1, the capacitor conductor layer 51d is shaped so as to follow the shape of the coil conductor layer 41b with the fixed first gap therebetween, and the capacitor conductor layer 51c is shaped so as to follow the shape of the coil conductor layer 41a with the fixed second gap therebetween. The first gap is larger than the second gap. The portion of the capacitor conductor layer 51c that is shaped so as to follow the shape of the coil conductor layer 41a does not overlap the capacitor conductor layer 51d when viewed in the widthwise direction W. Therefore, occurrence of variations in the capacitance value between the capacitor conductor layers 51c and 51d, which face each other in the widthwise direction W, can be further suppressed.

(3) In the electronic component 1, each of the plurality of coil conductor layers 41a to 41f is in the same layer as a corresponding one of the plurality of capacitor conductor layers 51c to 51h, and the capacitor conductor layers 51c to 51h, each of which is in the same layer as a corresponding one of the coil conductor layers 41a to 41f, are each shaped so as to follow the shape of the corresponding one of the coil conductor layers 41a to 41f with a fixed gap therebetween. The fixed gaps between the capacitor conductor layers 51c to 51h and the corresponding coil conductor layers 41a to 41f each correspond to one of the above-mentioned first and second gaps, and the first gaps and the second gaps are alternately present in the widthwise direction W. With this configuration, occurrence of variations in the capacitance value between the capacitor conductor layers 51d and 51h, which face each other in the widthwise direction W, can be suppressed.

(4) In the electronic component 1, the capacitance value affects the resonant frequency of the LC resonance circuit including the coil 40 and the capacitor 50. Therefore, in the electronic component 1, by suppressing the occurrence of variations in the capacitance value in the manner described above, occurrence of variations in the resonant frequency can be suppressed.

(5) In the electronic component 1, the coil conductor layers 41a to 41f include the parallel portions, which are portions of the coil conductor layers 41c and 41d that are electrically connected in parallel to each other, between the via-conductor layer 42c and the via-conductor layer 42d. Such parallel portions can reduce the electric resistance of the coil 40 and can improve the Q value of the coil 40, that is, the Q characteristic of the LC resonance circuit.

(6) Each of the capacitor conductor layers 51a to 51j of the capacitor 50 each have a substantially rectangular external shape and are cut away so as not to overlap the coil conductor layers 41a to 41f. The capacitor conductor layers 51a to 51j are shaped so as to follow the shapes of the first outer electrode 20 and the second outer electrode 30 such that there are the fixed third gaps between the capacitor conductor layers 51a to 51j and the first and second outer electrodes 20 and 30. Therefore, capacitance can be generated also between the first and second outer electrodes 20 and 30 and the capacitor conductor layers 51a to 51j, and the capacitance value can be obtained with improved efficiency. In addition, the resonant frequency of the electronic component 1 can be shifted further toward the low-frequency side, and the design range of the electronic component 1 can be increased.

(7) The number of times each of the coil conductor layers 41a to 41f is wound (the number of turns of each of the coil conductor layers 41a to 41f) is less than one turn, and each of the coil conductor layers 41a to 41f has a shape formed by cutting out a portion of a ring. Cutout portions of the coil conductor layers 41a to 41f, which are located between the two end portions of the coil conductor layers 41a to 41f, each face one of the capacitor conductor layers 51c to 51h that is in the same layer as the cutout portion, and in the body 10, the cutout portions of the coil conductor layers 41a to 41f are not located on the side on which the capacitor conductor layers 51a to 51j are not arranged and on which the upper surface 12 is present. Consequently, unevenness in the arrangement of the conductor layers in the body 10 can be reduced, and thus, variations in thermal stress in the body 10 can be reduced. Variations in the above-mentioned thermal stress affects the reliability of the electronic component 1, and accordingly, with the above-described configuration, the reliability of the electronic component 1 can be improved.

(8) In the electronic component 1, each of the third gaps related to the capacitor conductor layers 51b, 51d, 51f, 51h, and 51j is larger than each of the third gaps related to the capacitor conductor layers 51a, 51c, 51e, 51g, and 51i. With this configuration, in the electronic component 1, occurrence of variations in the capacitance value can be further suppressed.

(9) The electronic component 1 is mounted onto the circuit board while the mounting surface 11 of the body 10, at which the first outer electrode 20 and the second outer electrode 30 are exposed, faces the circuit board. The coil 40 is a substantially helical coil formed by connecting in series the plurality of coil conductor layers 41a to 41f that are arranged in the direction perpendicular to the first and second side surfaces 13 and 14, which are perpendicular to the mounting surface 11, to one another. Accordingly, the coil axis of the coil 40 is parallel to the circuit board on which the electronic component 1 has been mounted. Thus, a magnetic flux generated by the coil 40 is less likely to be blocked by a ground wiring line or a pad of the circuit board. Therefore, the inductance (L value) of the coil 40 can be obtained with improved efficiency, and decrease in the Q values of the coil 40 and the electronic component 1 can be suppressed.

(10) In the electronic component 1, the first outer electrode 20, the coil 40 (the first extended conductor layer 40b, the plurality of coil conductor layers 41a to 41f, and the second extended conductor layer 40c), and the second outer electrode 30 are electrically connected in series to one another in this order, and each of the capacitor conductor layers 51a to 51j is electrically connected to one of the first outer electrode 20 and the second outer electrode 30. The capacitor conductor layers 51a, 51c, 51e, 51g, and 51i that are connected to the first outer electrode 20 and the capacitor conductor layers 51b, 51d, 51f, 51h, and 51j that are connected to the second outer electrode 30 are alternately arranged along the widthwise direction W. Thus, a parallel LC resonance circuit can be formed between the first outer electrode 20 and the second outer electrode 30.

(11) In the electronic component 1, the mounting surface 11, the capacitor conductor layers 51c to 51h, and the coil conductor layers 41a to 41f are arranged in this order in the heightwise direction T, which is perpendicular to the mounting surface 11. Thus, the coil 40 is relatively far from the circuit board (circuit wiring lines), and the capacitor 50 is relatively close to the circuit board (circuit wiring lines), and the Q value of the coil 40 and the capacitance value of the capacitor 50 can both be improved, which in turn results in improvement of the characteristics of the electronic component 1.

(12) In the electronic component 1, as illustrated in FIG. 5, the capacitor conductor layers 51a to 51j include the capacitor conductor layer 51c, which is in the same layer as the first extended conductor layer 40b, and the capacitor conductor layer 51d, which is adjacent to the capacitor conductor layer 51c in the widthwise direction W. When viewed in the widthwise direction W, the capacitor conductor layer 51d does not overlap the capacitor conductor layer 51c. As described above, by forming the capacitor conductor layer 51d such that the capacitor conductor layer 51d does not overlap the first extended conductor layer 40b, occurrence of variations in the capacitance value can be suppressed. Similarly, occurrence of variations in the capacitance value can be suppressed between the second extended conductor layer 40c and the capacitor conductor layer 51g.

(13) In the electronic component 1, only the first outer electrode 20 is exposed at the first end surface 15, and only the second outer electrode 30 is exposed at the second end surface 16. With this configuration, the first outer electrode 20 and the second outer electrode 30 are respectively exposed at the first end surface 15 and the second end surface 16, which are perpendicular to the circuit board, and since mounting solder forms a fillet at the time of mounting the electronic component 1 onto the circuit board, the mountability of the electronic component 1 can be improved.

Note that the above-described embodiment may be implemented as follows.

Figure 6:
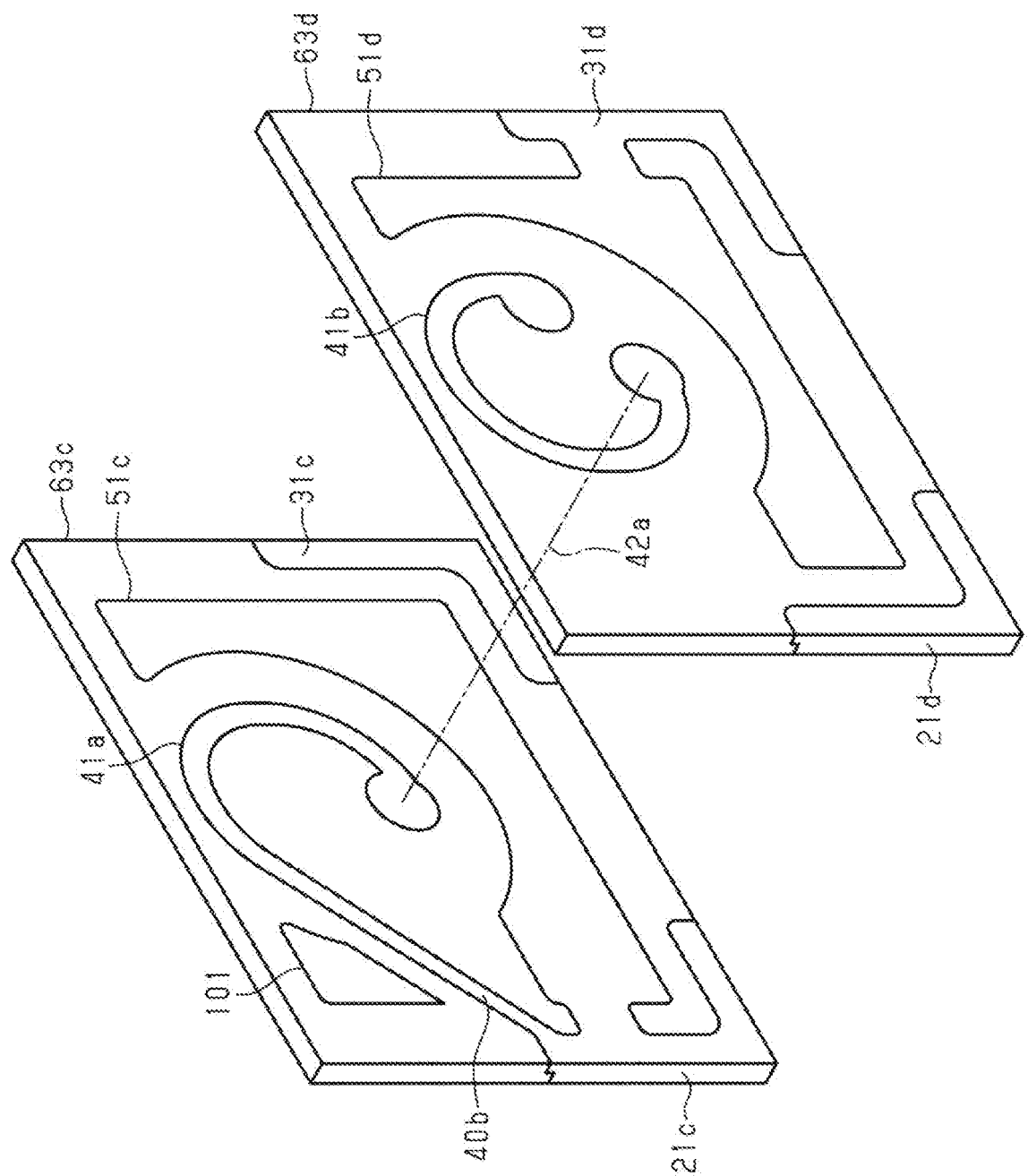
FIG. 6 is a perspective view illustrating insulator layers and conductor layers according to a modification.

As illustrated in FIG. 6, a dummy conductor layer 101 that is in the same layer as the first extended conductor layer 40b and that is not connected to any of the plurality of coil conductor layers 41a to 41f, the plurality of capacitor conductor layers 51a to 51j, the first outer electrode 20, the second outer electrode 30, the first extended conductor layer 40b, and the second extended conductor layer 40c may be formed. In this case, it is preferable that the dummy conductor layer 101 overlap one of the plurality of capacitor conductor layers 51a to 51j when viewed in the widthwise direction W. Note that, although not illustrated, another dummy conductor layer similar to that mentioned above may be formed in the same layer as the second extended conductor layer 40c illustrated in FIG. 5. Unevenness in the arrangement of the conductor layers in the body 10 can be reduced by the dummy conductor layer 101, and thus, variations in the thermal stress in the body 10 can be reduced. Therefore, the likelihood of a short-circuit occurring between the coil conductor layers 41a to 41f and the capacitor conductor layers 51a to 51j can be reduced without affecting the capacitance value.

As a modification of the above-described embodiment, the plurality of coil conductor layers 41a to 41f may include a coil conductor layer having a switching portion that is formed between the two end portions of the coil conductor layer and that does not face a capacitor conductor layer (one of the capacitor conductor layers 51c to 51h) in the same layer as the coil conductor layer.

Figure 7:
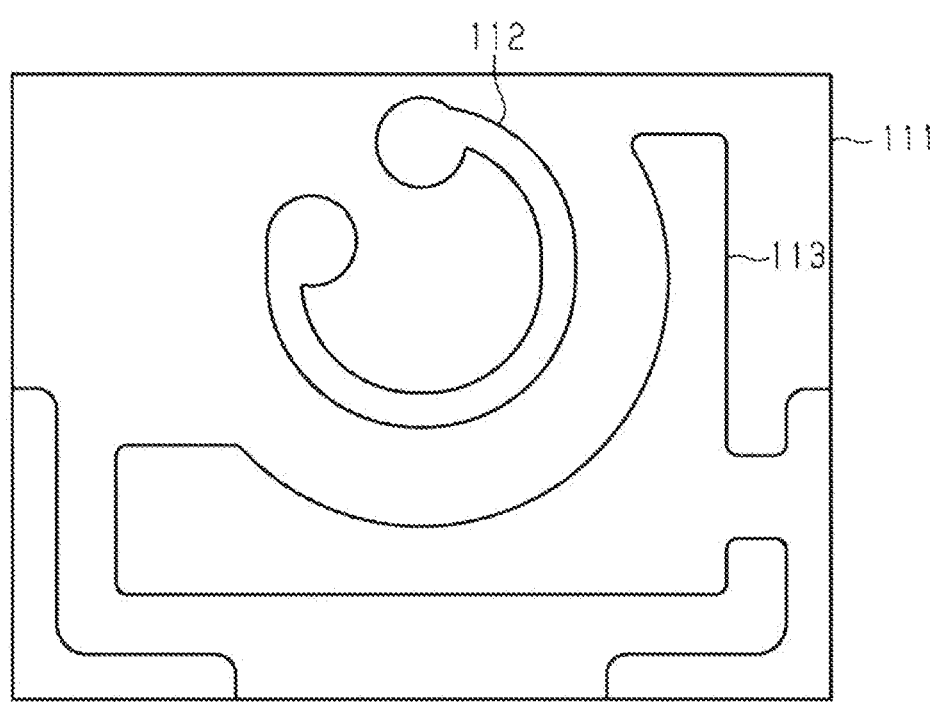
FIG. 7 is a front view illustrating an insulator layer and conductor layers according to another modification.

For example, as illustrated in FIG. 7, a switching portion (cutout portion) of a coil conductor layer 112 of an insulator layer 111 faces the side opposite to the side on which a capacitor conductor layer 113 is disposed. In this case, the area in which the coil conductor layer 112 and the capacitor conductor layer 113 face each other is larger than that in the above-described embodiment (e.g., the area in which the coil conductor layer 41b and the capacitor conductor layer 51d, which are illustrated in FIG. 5, face each other). Therefore, capacitance generated between the coil 40 and the capacitor 50 can be increased, and an adjustable range of the capacitance value obtainable in the electronic component 1 can be further increased.

As a modification of the above-described embodiment, the coil 40 does not need to include the parallel portions.

Figure 8:
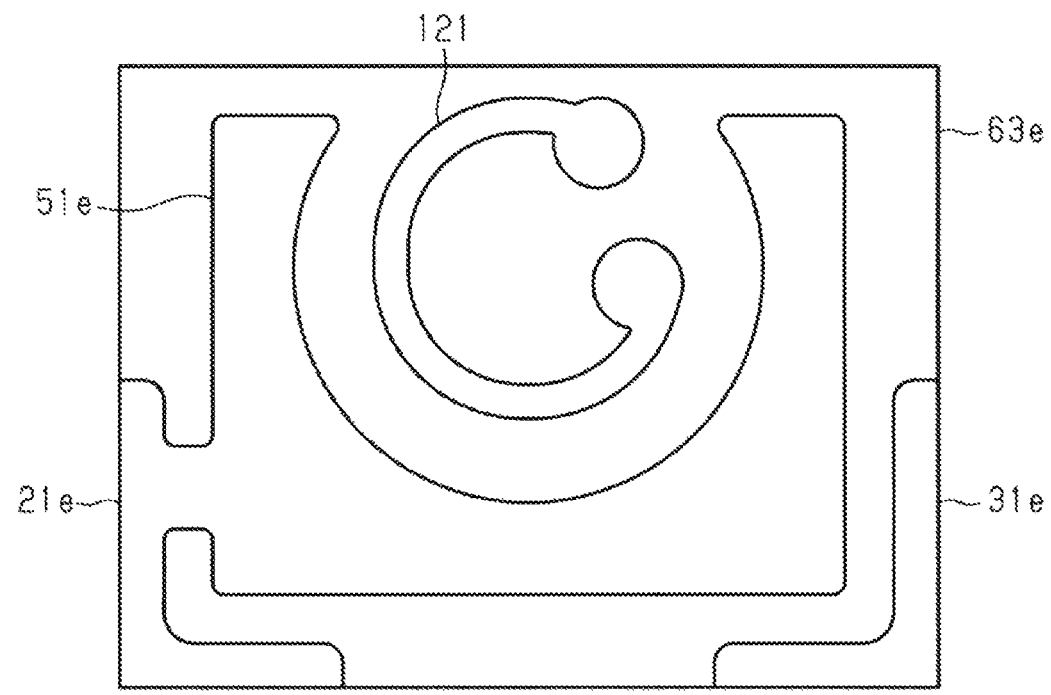
FIG. 8 is a front view illustrating an insulator layer and conductor layers according to another modification.

As illustrated in FIG. 8, a coil conductor layer 121 is formed on the insulator layer 63e. Unlike the coil conductor layer 41c illustrated in FIG. 5, the coil conductor layer 121 does not include a via pad to which the via-conductor layer 42c is to be connected. In the case where the coil conductor layer 121 is used, for example, a coil conductor layer extending from a via pad to which the via-conductor layer 42d is to be connected to a via pad to which the via-conductor layer 42e is to be connected is formed on the insulator layer 63f illustrated in FIG. 5.

In the above-described embodiment, the number of the insulator layers, the number of the coil conductor layer, the number of the capacitor conductor layers, and the number of the outer conductor layers may be suitably changed.

For example, a coil conductor layer may be formed on each of the insulator layers 63b and 63i, which are illustrated in FIG. 5. Alternatively, a coil conductor layer may be formed on each of the insulator layers 63a, 63b, 63i, and 63j. Alternatively, a coil conductor layer may be formed on each of the insulator layers 63a and 63b. Alternatively, a coil conductor layer may be formed on each of the insulator layers 63i and 63j. In such cases, the number of times the coil 40 is wound can be increased while the number of the insulator layers 60 laminated together in the body 10 is the same as that in the above-described embodiment, and the inductance or the L value can be increased. In other words, the obtainable range of the L value in an electronic component that includes a body having the same size as the body 10 of the above-described embodiment can be increased.

The capacitor conductor layers 51a and 51j of the insulator layers 63a and 63j may be omitted. Alternatively, the capacitor conductor layers 51a, 51b, 51i, and 51j of the insulator layers 63a, 63b, 63i, and 63j may be omitted. Alternatively, the capacitor conductor layers 51a and 51b of the insulator layers 63a and 63b may be omitted. Alternatively, the capacitor conductor layers 51i and 51j of the insulator layers 63i and 63j may be omitted.

In the above-described embodiment, although the outer terminal electrode 21 of the first outer electrode 20 and the outer terminal electrode 31 of the second outer electrode 30 are embedded in the body 10, the outer terminal electrode 21 of the first outer electrode 20 and the outer terminal electrode 31 of the second outer electrode 30 may be provided so as to be located outside the body 10.

In the above-described embodiment, although relationships between the shortest distances and between the fixed gaps that are similar to the above-described relationships are satisfied by any two of the capacitor conductor layers 51c to 51h that are adjacent to each other in the widthwise direction W, this is not essential, and at least one pair of the capacitor conductor layers that are adjacent to each other in the widthwise direction W may have different shortest distances and different fixed gaps.

In the above-described embodiment, although the configuration in which each of the third gaps related to the capacitor conductor layers 51b, 51d, 51f, 51h, and 51j is larger than each of the third gaps related to the capacitor conductor layers 51a, 51c, 51e, 51g, and 51i is employed, the present disclosure is not limited to this configuration. For example, the third gaps related to any two of the capacitor conductor layers that are adjacent to each other in the widthwise direction W may be equal to each other. Alternatively, all the third gaps related to the capacitor conductor layers 51a to 51j may be the same as one another or may be different from one another so as not to satisfy a specific relationship.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. An electronic component comprising:
a body having a first side surface;
a coil including a plurality of coil conductor layers each of which is wound in the body parallel to the first side surface; and
a capacitor including a plurality of capacitor conductor layers each of which is disposed in the body and each of which has a substantially plate-like shape parallel to the first side surface;
wherein
the plurality of coil conductor layers are arranged in a lamination direction that is perpendicular to the first side surface,
the plurality of capacitor conductor layers are arranged in the lamination direction and include a first capacitor conductor layer and a second capacitor conductor layer that are adjacent to each other in the lamination direction, the plurality of coil conductor layers include a first coil conductor layer that is in the same layer as the first capacitor conductor layer and a second coil conductor layer that is in the same layer as the second capacitor conductor layer, the body has a mounting surface that is perpendicular to the first side surface, the capacitor includes a first capacitance portion disposed between the mounting surface and the coil in a direction perpendicular to the mounting surface, and the shortest distance between the first coil conductor layer and the first capacitance portion of the first capacitor conductor layer is larger than shortest distance between the second coil conductor layer and the first capacitance portion of the second capacitor conductor layer.

2. The electronic component according to claim 1, wherein the first capacitor conductor layer has a shape along the first coil conductor layer with a fixed first gap, the second capacitor conductor layer has a shape along the second coil conductor layer with a fixed second gap, and the fixed first gap is larger than the fixed second gap.

3. The electronic component according to claim 2, wherein each of the plurality of coil conductor layers is in the same layer as one of the plurality of capacitor conductor layers, and each of the capacitor conductor layers, which are in the same layers as the corresponding coil conductor layers, has a shape along the corresponding coil conductor layer with a fixed gap, and each of the fixed gaps is correspond to one of the first gap and the second gaps, and the first gaps and the second gaps are alternately arranged in the lamination direction.

4. The electronic component according to claim 3, wherein the plurality of coil conductor layers include parallel portions that are electrically connected in parallel to each other.

5. The electronic component according to claim 2, wherein the plurality of coil conductor layers include parallel portions that are electrically connected in parallel to each other.

6. The electronic component according to claim 2, wherein each of the plurality of coil conductor layers is in the same layer as one of the plurality of capacitor conductor layers and is wound in less than one turn, and a cutout portion of each of the plurality of coil conductor layers that is located between two end portions of the coil conductor layer faces the corresponding capacitor conductor layer, which is in the same layer as the coil conductor layer.

7. The electronic component according to claim 2, wherein the plurality of coil conductor layers include a coil conductor layer that is in the same layer as one of the plurality of capacitor conductor layers and that is wound in less than one turn, the coil conductor layer including a cutout portion that is located between two end portions of the coil conductor layer and that does not face the capacitor conductor layer, which is in the same layer as the coil conductor layer.

8. The electronic component according to claim 2, further comprising:

a first outer electrode and a second outer electrode that are exposed at the body, wherein the first outer electrode, the plurality of coil conductor layers, and the second outer electrode are electrically connected in series to one another in this order, and each of the plurality of capacitor conductor layers is electrically connected to one of the first outer electrode and the second outer electrode, and the capacitor conductor layers connected to the first outer electrode and the capacitor conductor layers connected to the second outer electrode are alternately arranged along the lamination direction.

9. The electronic component according to claim 1, wherein the plurality of coil conductor layers include parallel portions that are electrically connected in parallel to each other.

10. The electronic component according to claim 1, wherein each of the plurality of coil conductor layers is in the same layer as one of the plurality of capacitor conductor layers and is wound in less than one turn, and a cutout portion of each of the plurality of coil conductor layers that is located between two end portions of the coil conductor layer faces the corresponding capacitor conductor layer, which is in the same layer as the coil conductor layer.

11. The electronic component according to claim 1, wherein the plurality of coil conductor layers include a coil conductor layer that is in the same layer as one of the plurality of capacitor conductor layers and that is wound in less than one turn, the coil conductor layer including a cutout portion that is located between two end portions of the coil conductor layer and that does not face the capacitor conductor layer, which is in the same layer as the coil conductor layer.

12. The electronic component according to claim 1, further comprising:

a first outer electrode and a second outer electrode that are exposed at the body, wherein the first outer electrode, the plurality of coil conductor layers, and the second outer electrode are electrically connected in series to one another in this order, and each of the plurality of capacitor conductor layers is electrically connected to one of the first outer electrode and the second outer electrode, and the capacitor conductor layers connected to the first outer electrode and the capacitor conductor layers connected to the second outer electrode are alternately arranged along the lamination direction.

13. The electronic component according to claim 12, wherein at the mounting surface, the first outer electrode and the second outer electrode are exposed, and the mounting surface, the first capacitor conductor layer, and the first coil conductor layer are arranged in this order in a direction perpendicular to the mounting surface.

14. The electronic component according to claim 13, wherein the body has a first end surface and a second end surface that are perpendicular to the first side surface and the mounting surface, and only the first outer electrode is exposed at the first end surface, and only the second outer electrode is exposed at the second end surface.

15. The electronic component according to claim 13, further comprising:

a first extended conductor layer extending parallel to the first side surface in the body and electrically connecting at least one of the plurality of coil conductor layers and the first outer electrode to each other; and a dummy conductor layer that is in the same layer as the first extended conductor layer and that is not connected to any of the plurality of coil conductor layers, the plurality of capacitor conductor layers, the first outer electrode, the second outer electrode, and the first extended conductor layer, wherein, when viewed in the lamination direction, the dummy conductor layer overlaps one of the plurality of capacitor electronic components.

16. The electronic component according to claim 13, wherein each of the plurality of capacitor conductor layers has a shape along at least one of the first outer electrode and the second outer electrode with a fixed third gap.

17. The electronic component according to claim 12, further comprising:

a first extended conductor layer extending parallel to the first side surface in the body and electrically connecting at least one of the plurality of coil conductor layers and the first outer electrode to each other; and a dummy conductor layer that is in the same layer as the first extended conductor layer and that is not electrically connected to any of the plurality of coil conductor layers, the plurality of capacitor conductor layers, the first outer electrode, the second outer electrode, and the first extended conductor layer, wherein, when viewed in the lamination direction, the dummy conductor layer overlaps one of the plurality of capacitor electronic components.

18. The electronic component according to claim 17, wherein the plurality of capacitor conductor layers include a third capacitor conductor layer that is in the same layer as the first extended conductor layer and a fourth capacitor conductor layer that is adjacent to the third capacitor conductor layer in the lamination direction, and when viewed in the lamination direction, the first extended conductor layer and the dummy conductor layer do not overlap the fourth capacitor conductor layer.

19. The electronic component according to claim 12, wherein each of the plurality of capacitor conductor layers has a shape along at least one of the first outer electrode and the second outer electrode with a fixed third gap.

20. The electronic component according to claim 19, wherein the fixed third gap related to the first capacitor conductor layer is larger than the fixed third gap related to the second capacitor conductor layer.

21. An electronic component comprising:

a body having a first side surface;

a coil including a plurality of coil conductor layers each of which is wound in the body parallel to the first side surface; and a capacitor including a plurality of capacitor conductor layers each of which is disposed in the body and each of which has a substantially plate-like shape parallel to the first side surface;

wherein the plurality of coil conductor layers are arranged in a lamination direction that is perpendicular to the first side surface, the plurality of capacitor conductor layers are arranged in the lamination direction and include a first capacitor conductor layer and a second capacitor conductor layer that are adjacent to each other in the lamination direction, the plurality of coil conductor layers include a first coil conductor layer that is in the same layer as the first capacitor conductor layer and a second coil conductor layer that is in the same layer as the second capacitor conductor layer, the shortest distance between the first coil conductor layer and the first capacitor conductor layer is larger than shortest distance between the second coil conductor layer and the second capacitor conductor layer, the body has a mounting surface that is perpendicular to the first side surface and first and second end surfaces that are perpendicular to the first side surface and the mounting surface, and the capacitor includes a first capacitance portion disposed between the mounting surface and the coil, a second capacitance portion disposed between the first end surface and the coil, and a third capacitance portion disposed between the second end surface and the coil.

* * * * *